(12) United States Patent
Lin et al.

(10) Patent No.: US 12,423,496 B2
(45) Date of Patent: Sep. 23, 2025

(54) METHODS FOR FORMING PATTERN LAYOUT, MASK, AND SEMICONDUCTOR STRUCTURE

(71) Applicant: Taiwan Semiconductor Manufacturing Company, Ltd., Hsinchu (TW)

(72) Inventors: Chun-Yen Lin, Hsinchu (TW); Tung-Heng Hsieh, Zhudong Town (TW); Bao-Ru Young, Zhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 470 days.

(21) Appl. No.: 17/744,088

(22) Filed: May 13, 2022

(65) Prior Publication Data

US 2023/0367946 A1    Nov. 16, 2023

(51) Int. Cl.
*G06F 30/392* (2020.01)
*H10D 30/01* (2025.01)

(52) U.S. Cl.
CPC ......... *G06F 30/392* (2020.01); *H10D 30/024* (2025.01)

(58) Field of Classification Search
CPC . G06F 30/392; H01L 21/027; H01L 21/0337; H01L 21/0334; H01L 21/3081; H01L 21/3086
See application file for complete search history.

(56) References Cited

U.S. PATENT DOCUMENTS

2017/0017745 A1*  1/2017  Wang ................... H10D 84/834

\* cited by examiner

*Primary Examiner* — Tuan A Hoang
(74) *Attorney, Agent, or Firm* — Birch, Stewart, Kolasch & Birch, LLP

(57) ABSTRACT

A method for forming a pattern layout is provided, including receiving an IC design layout including a layout block, a first line pattern is disposed inside the layout block along the first direction; forming a second line pattern disposed outside the layout block parallel to the first line patterns; forming a mandrel bar pattern oriented along the second direction and overlapping the first line pattern and the second line pattern, the mandrel bar pattern is between the first edge and the third edge of the layout block that are parallel to the first direction, and a first end of the mandrel bar pattern is separated from the first edge and overlaps a first side edge of one of the first line pattern or the second line pattern closest to the first edge; and outputting a pattern layout.

20 Claims, 22 Drawing Sheets

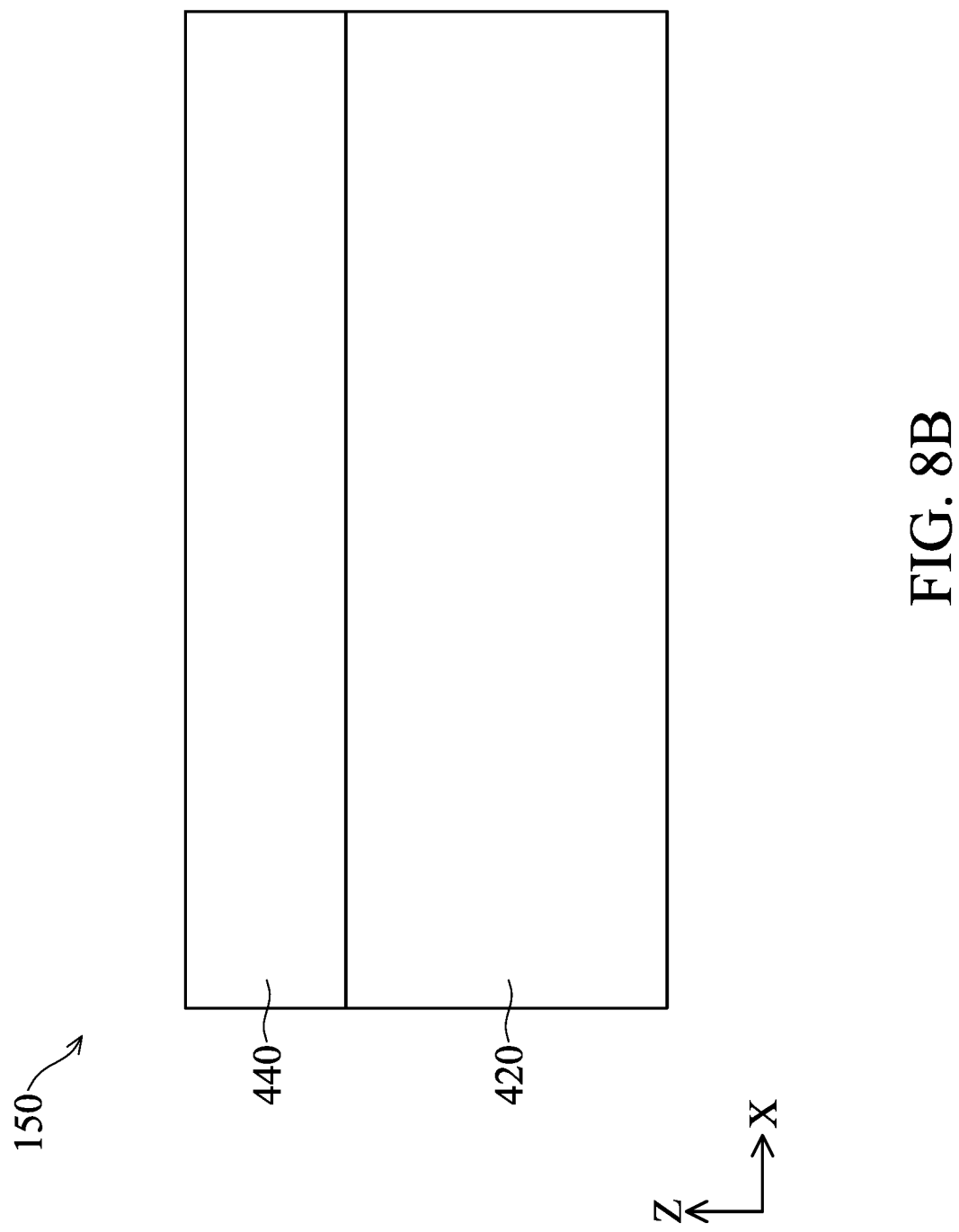

METHODS FOR FORMING PATTERN LAYOUT, MASK, AND SEMICONDUCTOR STRUCTURE

BACKGROUND OF THE INVENTION

Field of the Invention

The present invention relates to methods for forming a pattern layout, a mask, and a semiconductor structure.

Description of the Related Art

As integrated circuit (IC) technologies are continually progressing to smaller technology nodes, such as a 32 nm technology node and below, simply scaling down similar designs used at larger nodes often results in inaccurate or poorly shaped device features due to the resolution limit of conventional optical lithography technology. Examples of inaccurate or poorly shaped device features include rounding, pinching, necking, bridging, dishing, erosion, metal line thickness variations, and other characteristics that affect device performance. One approach to improving image printing quality on a wafer is to use restrictive design rules (RDR) in IC layout designs. An example IC layout according to RDR includes parallel line patterns extending in the same direction and spaced by a line pitch. The line width and line pitch are designed so as to improve image printing quality by utilizing constructive light interference.

However, in a large-scale IC, not all patterns are designed according to the same design rules. For example, an IC may include both logic circuits and embedded static random-access memory (SRAM) cells. The SRAM cells may use smaller line pitches for area reduction, while the logic circuits may use larger line pitches. For another example, an IC may include multiple off-the-shelf macros, each of which has been laid out according to its own set of RDRs. In such ICs, multiple layout blocks may be used. Each layout block is designed according to a set of RDRs and different layout blocks may use different RDRs. Regions between any two layout blocks are provided to accommodate printing inaccuracy such as line end rounding, as well as to meet certain spacing requirements for IC manufacturing. These regions become a concern when greater device integration is desired.

BRIEF SUMMARY OF THE INVENTION

A method for forming a pattern layout is included in some embodiments of the present disclosure. The method includes receiving an integrated circuit (IC) design layout including a layout block having a first edge, a second edge, a third edge, and a fourth edge sequentially connected to each other, wherein the first edge and the third edge extend in a first direction, and the second edge and the fourth edge extends in a second direction perpendicular to the first direction, wherein a first line patterns is disposed inside the layout block along the first direction. The method includes forming a second line pattern disposed outside the layout block parallel to the first line patterns. The method includes forming a mandrel bar pattern oriented along the second direction and overlapping the first line patterns and the second line pattern, wherein the mandrel bar pattern is between the first edge and the third edge, and a first end of the mandrel bar pattern is separated from the first edge and overlaps a first side edge of one of the first line patterns or the second line pattern closest to the first edge. The method includes outputting a pattern layout for mask fabricating, wherein the pattern layout includes the layout block, the first line patterns, second line pattern, and the mandrel bar pattern.

A method for forming a mask is provided in some embodiments of the present disclosure. The method includes receiving an integrated circuit (IC) design layout having a first layout block having a first edge extending in a first direction and a second edge extending in a second direction perpendicular to the first direction, the first layout block including first line patterns extended in the first direction. The method includes adding second line patterns extended in the first direction adjacent to the first layout block. The method includes adding a first mandrel bar pattern extended in the second direction and contacting the first line patterns and the second line patterns, wherein a first end of the first mandrel bar pattern is or aligns with a first side edge of one of the first line patterns or one of the second line patterns adjacent to the first edge, or between the first side edge and the first edge. The method includes outputting a pattern layout in a computer-readable format, wherein the pattern layout includes the layout block, the first and second line patterns, and the first mandrel bar pattern. The method includes fabricating a mask using the pattern layout.

A method of forming a semiconductor structure is provided in some embodiments of the present disclosure. The method includes providing a semiconductor substrate. The method includes forming a mandrel structure over the semiconductor substrate using a first mask, wherein the first mask includes first line patterns in a first layout block and extending along a first direction. The first mask further includes second line patterns outside the first layout block, connecting to the first layout block, and extending along the first direction. The first mask further includes a first mandrel bar disposed between the first line patterns and the second line patterns and extending along a second direction perpendicular to the first direction, wherein a first end of the first mandrel bar is aligned with one of the first line patterns or one of the second line patterns. The method includes performing a cutting process to the mandrel structure to form a fin structure. The method includes forming gates over the fin structure along the second direction.

BRIEF DESCRIPTION OF THE DRAWINGS

Aspects of the present disclosure are best understood from the following detailed description when they are read with the accompanying figures. It is noted that, in accordance with the standard practice in the industry, various features are not drawn to scale. In fact, the dimensions of the various features may be arbitrarily increased or reduced for clarity of discussion.

FIG. 8A, FIG. 8B, FIG. 8C, FIG. 9A, FIG. 9B, FIG. 10A, FIG. 10B, FIG. 11A, and FIG. 11B illustrate top view or cross-sectional view of an IC in various manufacturing steps of the method shown in FIG. 3, according to various aspects of the present disclosure.

DETAILED DESCRIPTION OF THE INVENTION

Figure 1:
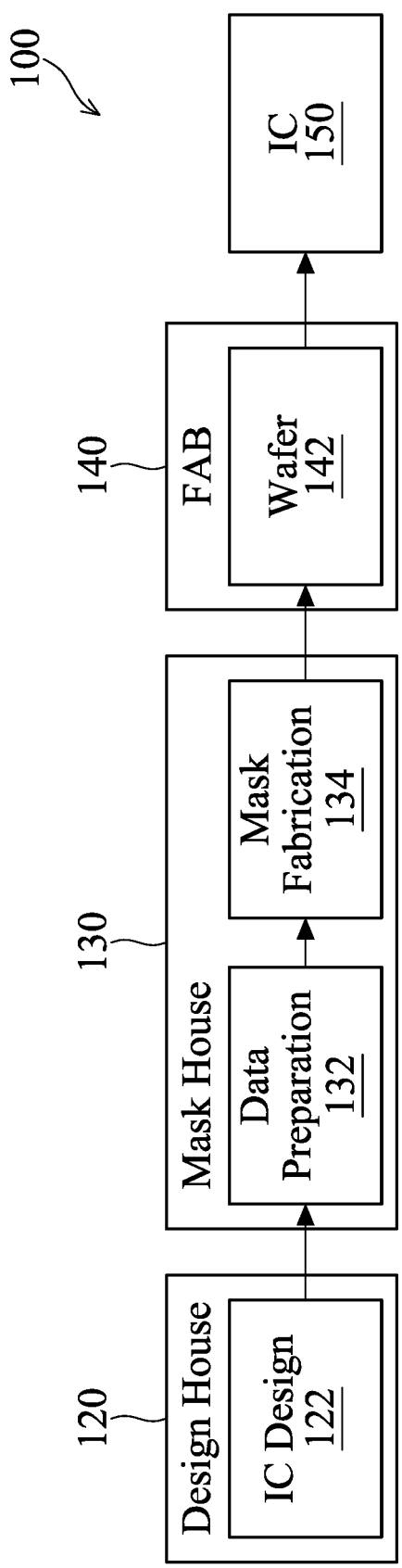
FIG. 1 is a simplified block diagram of an embodiment of an integrated circuit (IC) manufacturing system and an associated IC manufacturing flow.

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are in direct contact, and may also include embodiments in which additional features may be disposed interposing the features, such that the features may not be in direct contact. In addition, spatially relative terms, for example, "vertical," "above," "over," "below,", "bottom," etc. as well as derivatives thereof (e.g., "downwardly." "upwardly." etc.) are used in the present disclosure for ease of description of one feature's relationship to another feature. The spatially relative terms are intended to cover different orientations of the device, including the features.

Unless defined otherwise, all technical and scientific terms used herein have the same meaning as commonly understood by one of ordinary skill in the art to which this invention belongs. It should be appreciated that each term, which is defined in a commonly used dictionary, should be interpreted as having a meaning conforming to the relative skills and the background or the context of the present disclosure, and should not be interpreted in an idealized or overly formal manner unless defined otherwise.

Use of ordinal terms such as "first", "second", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

The terms "about" and "substantially" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. When there is no specific description, the stated value includes the meaning of "about" or "substantially".

Furthermore, the phrase "in a range between a first value and a second value" or "in a range from a first value to a second value" indicates that the range includes the first value, the second value, and other values between them.

Methods for forming a pattern layout for making a mask, and methods of forming a semiconductor structure using the mask are provided in some embodiments of the present disclosure. The method shrinks the length of the mandrel bar between device patterns and dummy patterns with certain rules, which gives greater space between the patterns, thereby prevents space violation. The subsequently processes may be facilitated by such pattern design.

FIG. 1 is a simplified block diagram of an IC manufacturing system 100 and an IC manufacturing flow associated therewith, in accordance with some embodiments of the present disclosure. The IC manufacturing system 100 includes a plurality of entities, such as a design house 120, a mask house 130, and an IC manufacturer 140 (i.e., a fab), that interact with one another in the design, development, and manufacturing cycles and/or services related to manufacturing an IC 150. The plurality of entities are connected by a communications network, which may be a single network or a variety of different networks, such as an intranet and the Internet, and may include wired and/or wireless communication channels. Each entity may interact with other entities and may provide services to and/or receive services from the other entities. One or more of the design house 120, mask house 130, and IC manufacturer 140 may be owned by a single larger company, and may even coexist in a common facility and use common resources.

The design house (or design team) 120 generates an IC design layout 122. The IC design layout 122 includes various geometrical patterns designed for the IC 150. The various geometrical patterns in the IC design layout 122 may correspond to patterns of metal, oxide, or semiconductor layers that make up various components of the IC 150 to be fabricated. The various components may include active regions, gate electrodes, metal lines or vias of an interlayer interconnection, and openings for bonding pads, which are to be formed in a semiconductor substrate (such as a silicon wafer) and various material layers disposed on the semiconductor substrate. In an embodiment, the device patterns are transferred to a mandrel structure used in a pattering process for IC 150 fabrication. In some embodiments, dummy patterns are added outside the layout blocks to improve pattern density. The design house 120 implements a proper design procedure to form the IC design layout 122. The design procedure may include logic design, physical design, and/or place and route. The IC design layout 122 is presented in one or more data files having information of the geometrical patterns. For example, the IC design layout 122 can be expressed in a GDSII file format, a DFII file format, or another suitable computer-readable data format.

The mask house 130 uses the IC design layout 122 to manufacture one or more masks to be used for fabricating various layers of the IC 150. The mask house 130 performs mask data preparation 132, mask fabrication 134, and other suitable tasks. The mask data preparation 132 translates the IC design layout 122 into a form that can be physically written by a mask writer. The mask fabrication 134 then fabricates a plurality of masks that are used for patterning a substrate (e.g., a wafer). In the present embodiment, the mask data preparation 132 and mask fabrication 134 are illustrated as separate elements. However, the mask data preparation 132 and mask fabrication 134 can be collectively referred to as mask data preparation.

In some embodiments, the mask data preparation 132 prepares a mandrel pattern layout and a cut pattern layout to be used in a patterning process. The preparation of the mandrel pattern includes extending the device patterns (e.g., in the operation 204), inserting dummy patterns (e.g., dummy line patterns) outside the layout blocks to improve pattern density and device density (e.g., in the operation 206), and adding mandrel bar patterns to connect the device patterns and adjacent dummy patterns (e.g., in the operation 08). The mandrel pattern layout defines a mandrel pattern in a first exposure and the cut pattern layout defines a cut pattern in a second exposure. The cut pattern removes unwanted portions of the mandrel pattern, a derivative, or both. The final pattern includes the mandrel pattern plus the derivative but not the cut pattern.

The mask data preparation 132 may further include optical proximity correction (OPC) which uses lithography enhancement techniques to compensate for image errors, such as those that can arise from diffraction, interference, or other process effects. The mask data preparation 132 may further include a mask rule checker (MRC) that checks the IC design layout with a set of mask creation rules which may contain certain geometric and connectivity restrictions to ensure sufficient margins, to account for variability in semiconductor manufacturing processes, etc. In an embodiment, portions of the device patterns are connected according to the MRC. In another embodiment, mandrel bar patterns are included according to the MRC. The mask data preparation 132 may further include lithography process checking (LPC) that simulates processing that will be implemented by the IC manufacturer 140 to fabricate the IC 150. The processing parameters may include parameters associated with various processes of the IC manufacturing cycle, parameters associated with tools used for manufacturing the IC, and/or other aspects of the manufacturing process.

It should be understood that the above description of the mask data preparation 132 has been simplified for the purposes of clarity, and data preparation may include additional features such as a logic operation (LOP) to modify the IC design layout according to manufacturing rules. Additionally, the processes applied to the IC design layout 122 during mask data preparation 132 may be executed in a variety of different orders.

After mask data preparation 132 and during mask fabrication 134, a mask or a group of masks are fabricated based on the modified IC design layout. For example, an electron-beam (e-beam) or a mechanism of multiple e-beams is used to form a pattern on a mask (photomask or reticle) based on the modified IC design layout. The mask can be formed in various technologies such as a transmissive mask or a reflective mask. In an embodiment, the mask is formed using binary technology, where a mask pattern includes opaque regions and transparent regions. A radiation beam, such as an ultraviolet (UV) beam, used to expose the image sensitive material layer (e.g., photoresist) coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask can be attenuated PSM or alternating PSM.

The IC manufacturer 140, such as a semiconductor foundry, uses the mask (or masks) fabricated by the mask house 130 to fabricate the IC 150. The IC manufacturer 140 is an IC fabrication business that can include a myriad of manufacturing facilities for the fabrication of a variety of different IC products. For example, there may be a manufacturing facility for the front end fabrication of a plurality of IC products (i.e., front-end-of-line (FEOL) fabrication), while a second manufacturing facility may provide the back end fabrication for the interconnection and packaging of the IC products (i.e., back-end-of-line (BEOL) fabrication), and a third manufacturing facility may provide other services for the foundry business. In the present embodiment, a semiconductor wafer 142 is fabricated using the mask (or masks) to form the IC 150. The semiconductor wafer 142 includes a silicon substrate or other proper substrate having material layers formed thereon. Other proper substrate materials include another suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. The semiconductor wafer may further include various doped regions, dielectric features, and multilevel interconnects (formed at subsequent manufacturing steps). The mask may be used in a variety of processes. For example, the mask may be used in an ion implantation process to form various doped regions in the semiconductor wafer, in an etching process to form various etching regions in the semiconductor wafer, and/or other suitable processes.

Figure 2:
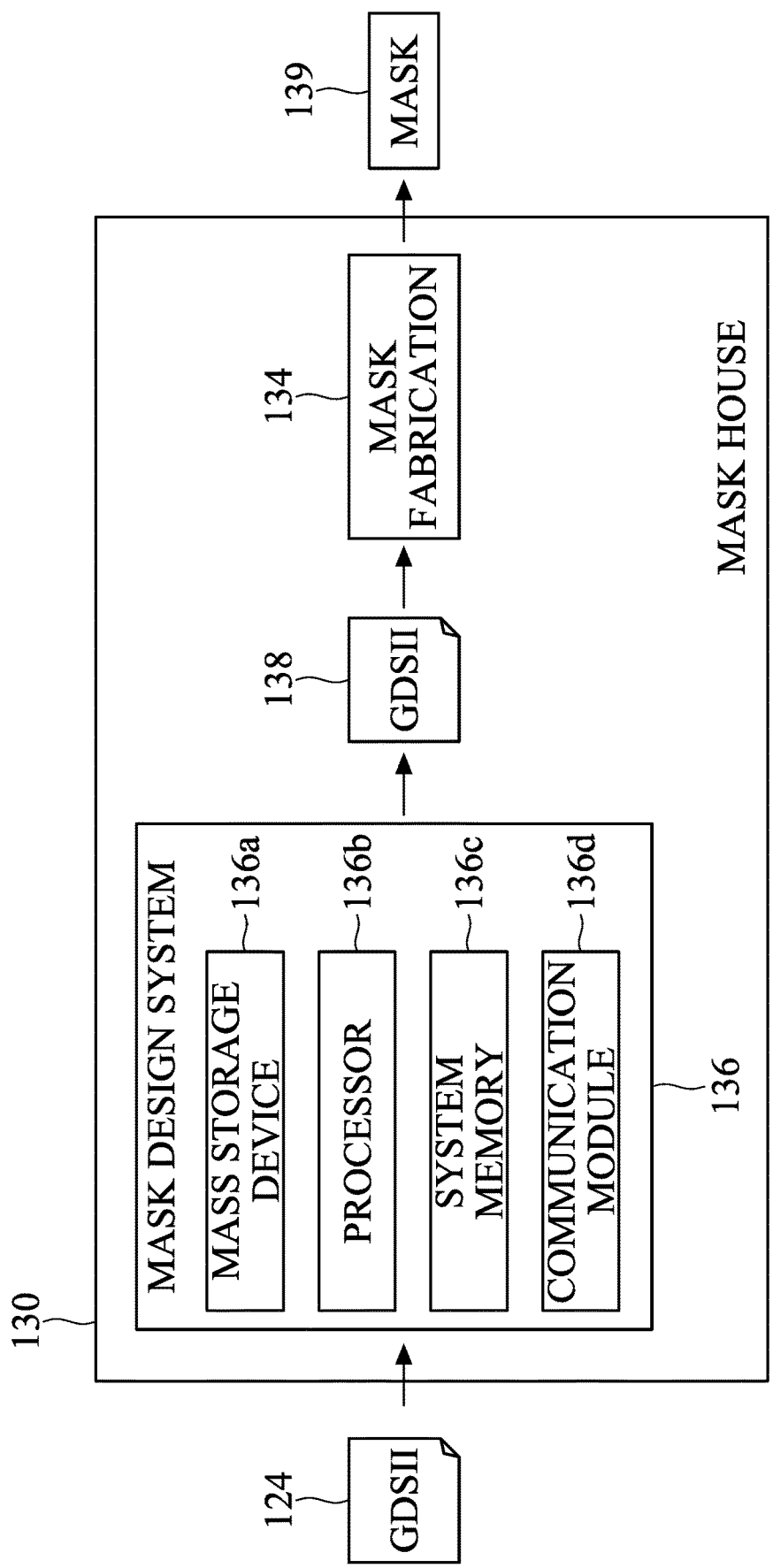
FIG. 2 is a more detailed block diagram of the mask house shown in FIG. 1 according to various aspects of the present disclosure.

FIG. 2 is a more detailed block diagram of the mask house 130 shown in FIG. 1 according to various aspects of the present disclosure. In the illustrated embodiment, the mask house 130 includes a mask design system 136 that is tailored to perform the functionality described in association with mask data preparation 132 of FIG. 1. The mask design system 136 is an information handling system such as a computer, server, workstation, or other suitable device. The mask design system 136 includes a processor 136b that is communicatively coupled to a system memory 136c, a mass storage device 136a, and a communication module 136d. The system memory 136c provides the processor 136b with non-transitory, computer-readable storage to facilitate execution of computer instructions by the processor. Examples of system memory may include random access memory (RAM) devices such as dynamic RAM (DRAM), synchronous DRAM (SDRAM), solid state memory devices, and/or a variety of other memory devices known in the art. Computer programs, instructions, and data are stored on the mass storage device 136a. Examples of mass storage devices may include hard drives, optical drives, magneto-optical drives, solid-state storage devices, and/or a variety of other mass storage devices known in the art. The communication module 136d is operable to communicate information such as IC design layout files with the other components in the IC manufacturing system 100, such as the design house 120. Examples of communication modules may include Ethernet cards, 802.11 WiFi devices, cellular data radios, and/or other suitable devices.

In operation, the mask design system 136 is configured to manipulate the IC design layout 122 before it is transferred to a mask by the mask fabrication 134. In an embodiment, the mask data preparation 132 in FIG. 1 is implemented as software instructions executing on the mask design system 136 in FIG. 2. To further this embodiment, the mask design system 136 receives a first GDSII file 124 containing the IC design layout 122 from the design house 120, and modifies the IC design layout 122, for example, to extend the device patterns, to insert dummy patterns, to connect device patterns under MRC, to insert mandrel bar patterns, and to perform other manufacturability enhancement. After the mask data preparation 132 is complete, the mask design system 136 transmits a second GDSII file 138 containing a modified IC design layout to the mask fabrication 134. In alternative embodiments, the IC design layouts 122 and 138 may be transmitted between the components in IC manufacturing system 100 in alternate file formats such as DFII, CIF, OASIS, or any other suitable file type. Further, the mask design system 136 and the mask house 130 may include additional and/or different components in alternative embodiments.

Figure 3:
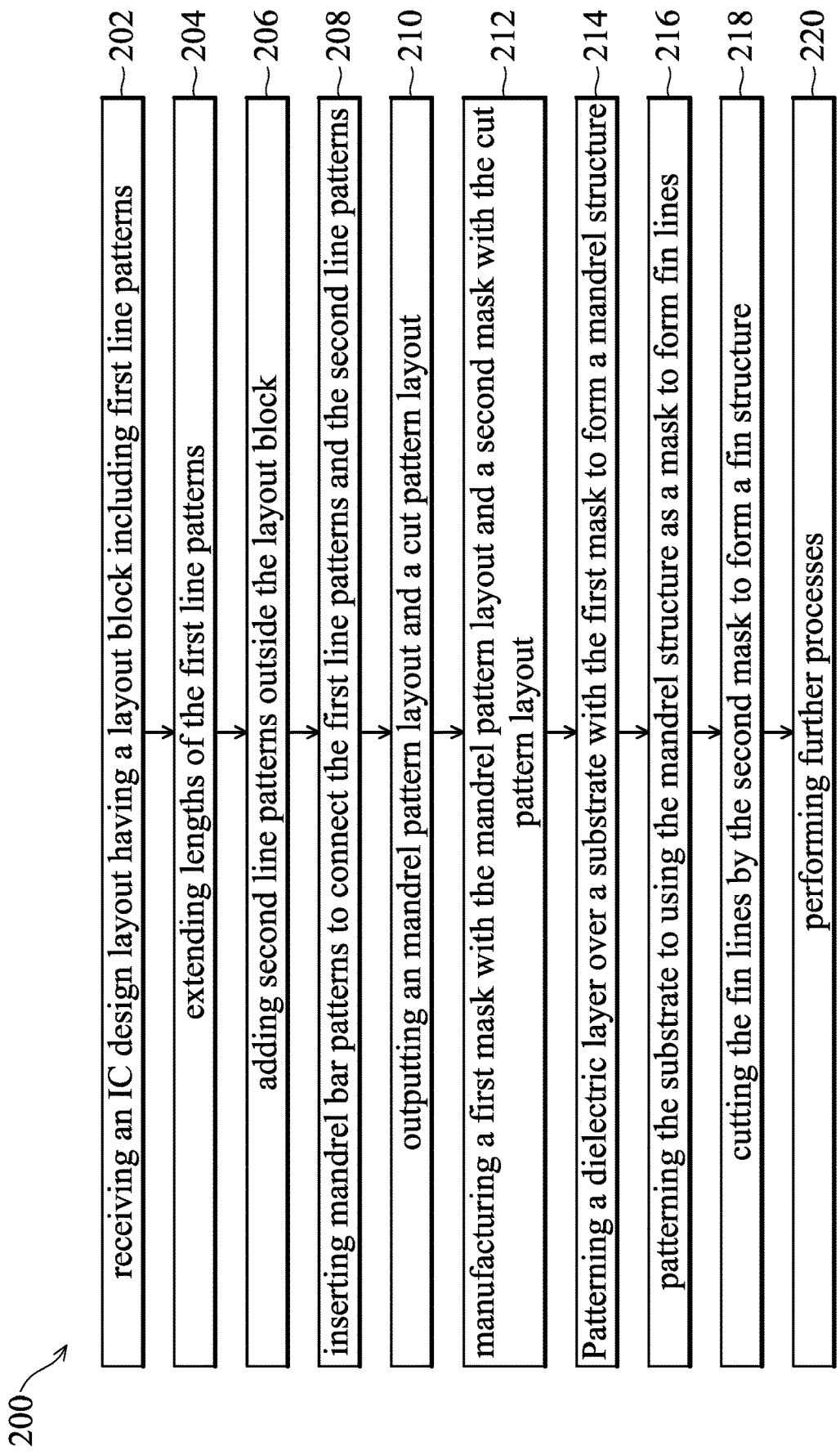
FIG. 3 shows a flowchart of a method of manufacturing an IC according to various aspects of the present disclosure.

FIG. 3 is a flowchart of a method 200 of manufacturing the IC 150 according to various aspects of the present disclosure. In a brief overview, the method 200 includes operations 202, 204, 206, 208, 210, 212, 214, 216, 218, and 220. The operation 202 receives an IC design layout having a layout block including first line patterns. The operation 204 modifies the IC design layout by extending the device patterns (e.g., first line patterns) inside the layout blocks to form extended device patterns. The operation 206 forms dummy patterns (e.g., second line patterns) in the space outside the layout block. The operation 208 inserts mandrel bars between the device patterns and the dummy patterns, thereby connecting the device patterns (first line patterns) to adjacent dummy patterns (second line patterns). The operation 210 outputs a mandrel pattern layout and a cut pattern layout for mask fabrication. The operation 212 fabricates a first mask with the mandrel pattern layout and a second mask with the cut pattern layout. The operation 214 patterns a dielectric layer over the IC substrate with the first mask to form a mandrel structure. The operation 216 transfers the mandrel patterns into the IC substrate using the mandrel structure as a mask. Thereafter, the operation 218 performs a cutting process to remove unwanted portions of the mandrel structure to form a fin structure. The method 200 then performs additional processes 220 necessary to form the IC 150.

The method 200 may be implemented in the various components of the IC manufacturing system 100. For example, the operations 202, 204, 206, 208, and 210 may be implemented in the mask data preparation 132 of the mask house 130. The operation 212 may be implemented in the mask fabrication 134 of the mask house 130. The operations 216, 218, and 220 may be implemented in the IC manufacturer 140. The method 200 is merely an example for illustrating various aspects of the provided subject matter. Additional operations can be provided before, during, and after the method 200, and some operations described can be replaced, eliminated, or moved around for additional embodiments of the method 200. The method 200 in FIG. 3 is a high-level overview and details associated with each operation therein will be described in association with the subsequent figures in the present disclosure.

Figure 4:
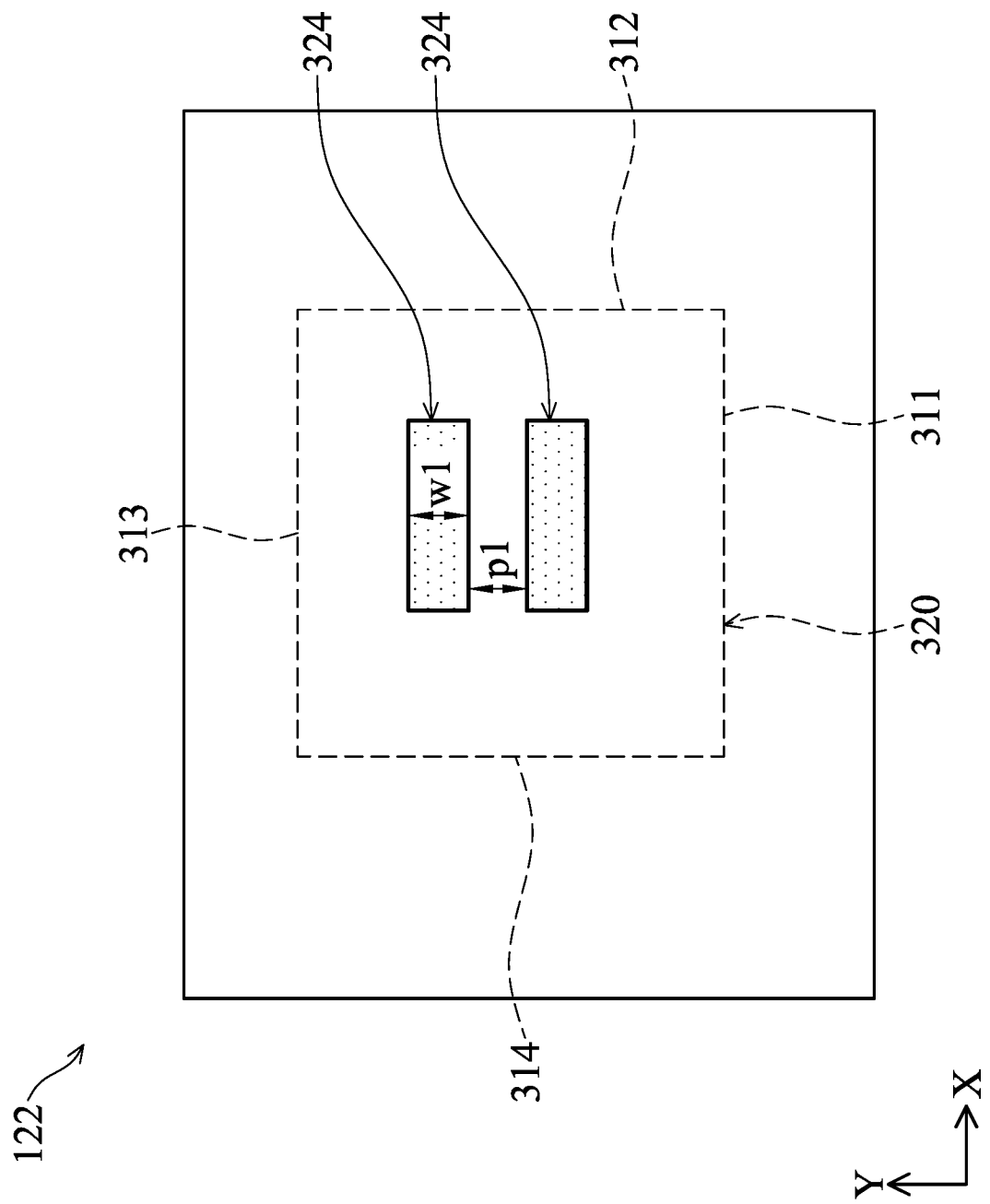
FIG. 4 illustrates an IC layout having a layout block according to various aspects of the present disclosure.

FIG. 4 illustrates an IC layout having a layout block according to various aspects of the present disclosure. At operation 202, referring to FIG. 3 and FIG. 4, the method 200 receives the IC design layout 122. The IC design layout 122 includes various geometrical patterns (e.g., patterns corresponding to devices, such as first line patterns) for creating features of an IC. In the present embodiment, these geometrical patterns are confined in layout blocks, for example, layout block 320. The layout block may be any user defined shapes such as square, rectangle, oval, circle, and/or other regular or irregular shapes. The layout block may be uniform in size and/or evenly distributed across the substrate.

In some embodiments, the IC design layout 122 includes a layout block 320. The layout block 320 is a rectangular region and includes patterns conforming to certain restricted design rules. Distances of the borders (or edges) of the layout block 320 from the device patterns inside are the minimum width that the mask fabricator can process. For example, the layout block 320 may include a first edge 311, a second edge 312, a third edge 313, and a fourth edge 314 sequentially connected to each other. In some embodiment, the first edge 311 and the third edge 313 may be parallel and extending along a first direction (e.g. the X direction), and the second edge 312 and the fourth edge 314 may be parallel and extending along a second direction (e.g. the Y direction). The layout block 320 is such designed to accommodate the later formed dummy patterns outside the layout block 320 to achieve required pattern density and device density. Among other benefits, the present disclosure resolves such issues and simplifies the dummy pattern layout. For example, the dummy patterns outside the layout block 320 may use uniform line width and line pitch throughout the entire IC design layout 122 while still maintain desirable pattern density (e.g., about 30% to about 5(%).

In the present embodiments, the layout block 320 includes device patterns 324 having the line width w1. The distance between device patterns 324 along Y direction is line pitch p1. The line pitch p1 is defined as the distances between adjacent edges of the line patterns in the present embodiment. They may also be defined using edge-to-edge distance or center-line-to-center-line distance in alternative embodiments. It is noted that the device patterns in FIG. 4 are for illustration only and not intended to be limiting beyond what is specifically recited in the claims.

The layout block 320 may include circuit elements (e.g., logic circuits and SRAM cells). Further, the layout block 320 is shown in rectangular region for the purpose of simplification and is may be in other shapes or other polygons in various embodiments. The layout block 320 is outlined in dotted lines for illustration purposes only, and the dotted lines are not part of the pattern layout.

In some embodiments, the device patterns 324 may be used for creating IC features such as active regions, source and drain features, gate electrodes, metal lines or vias, and openings for bonding pads. In the present embodiment, the device patterns 324 define a mandrel pattern that will be used for etching a substrate to form fins for fin field effect transistors (FinFETs).

In a typical design, due to the limitations of the conventional optical lithography technology, the ends of the line patterns (e.g., the device patterns 324) may become rounded after being printed on a wafer and thereby compromising device performances. The line patterns may be extended lengthwise to pattern a substrate (e.g., a wafer), the round endings of the resulting lines are cut (or shortened, trimmed) using a cut pattern to achieve intended length for the line patters. However, if the extended line patterns are too close to each other, the line ends may connect to each other accidentally in an uncontrolled manner after transferring to the substrate due to the limitations of the conventional optical lithography technology, thereby causing processing issues in subsequent processes. For example, the uncontrolled connections between the ends of the line patterns may break off and shift to other portions of the substrate, thereby causing inadvertent patterns between lines. Therefore, it is desirable to reduce or eliminate small spaces between the ends of the line patterns to improve design density and reducing manufacturing defects. The provided subject matter addresses this issue, among others.

Figure 5:
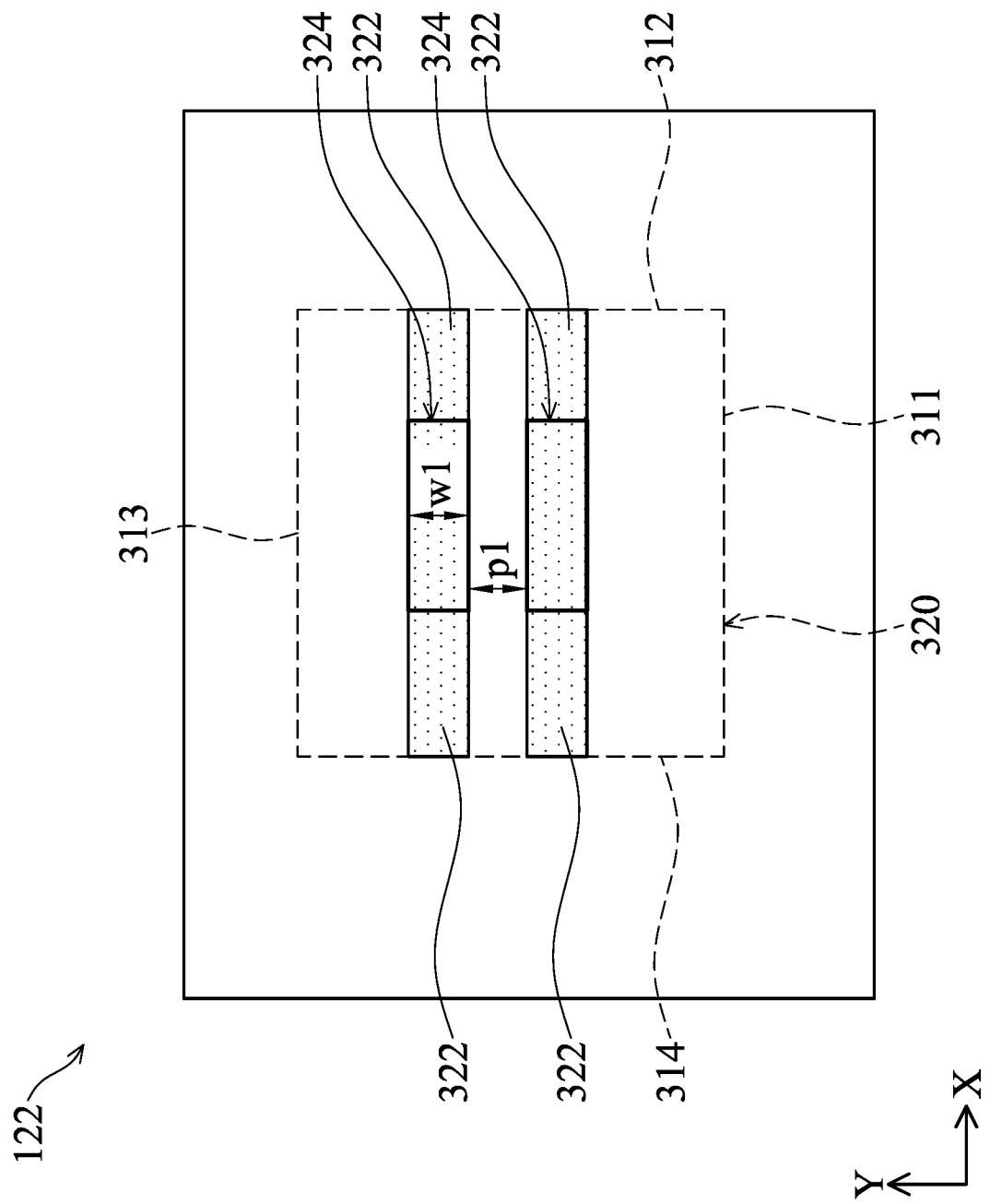
FIG. 5, FIG. 6, and FIG. 7 illustrate modified IC design layouts according to the method shown in FIG. 3, according to various aspects of the present disclosure.
Figure 6:
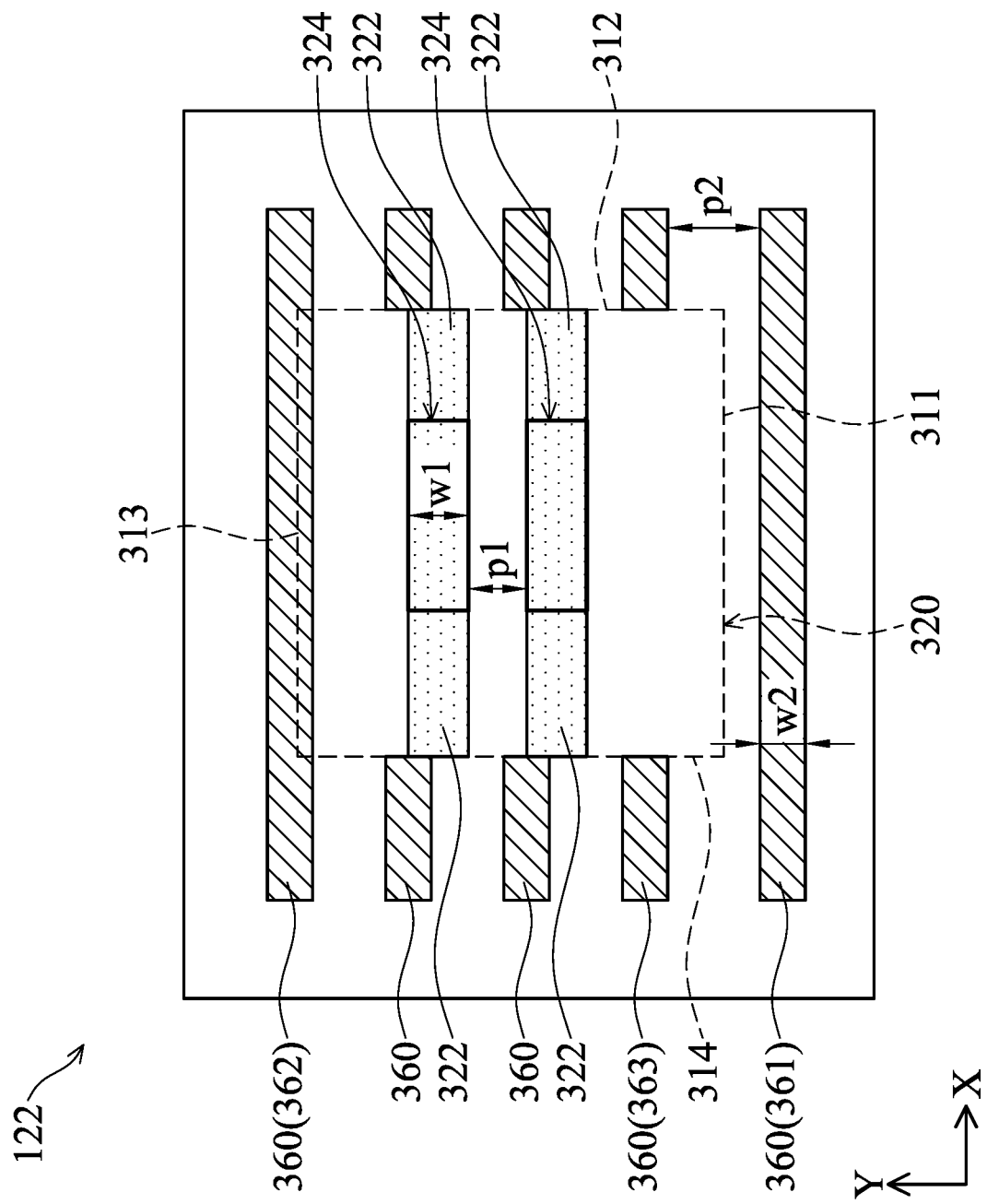
Figure 7:
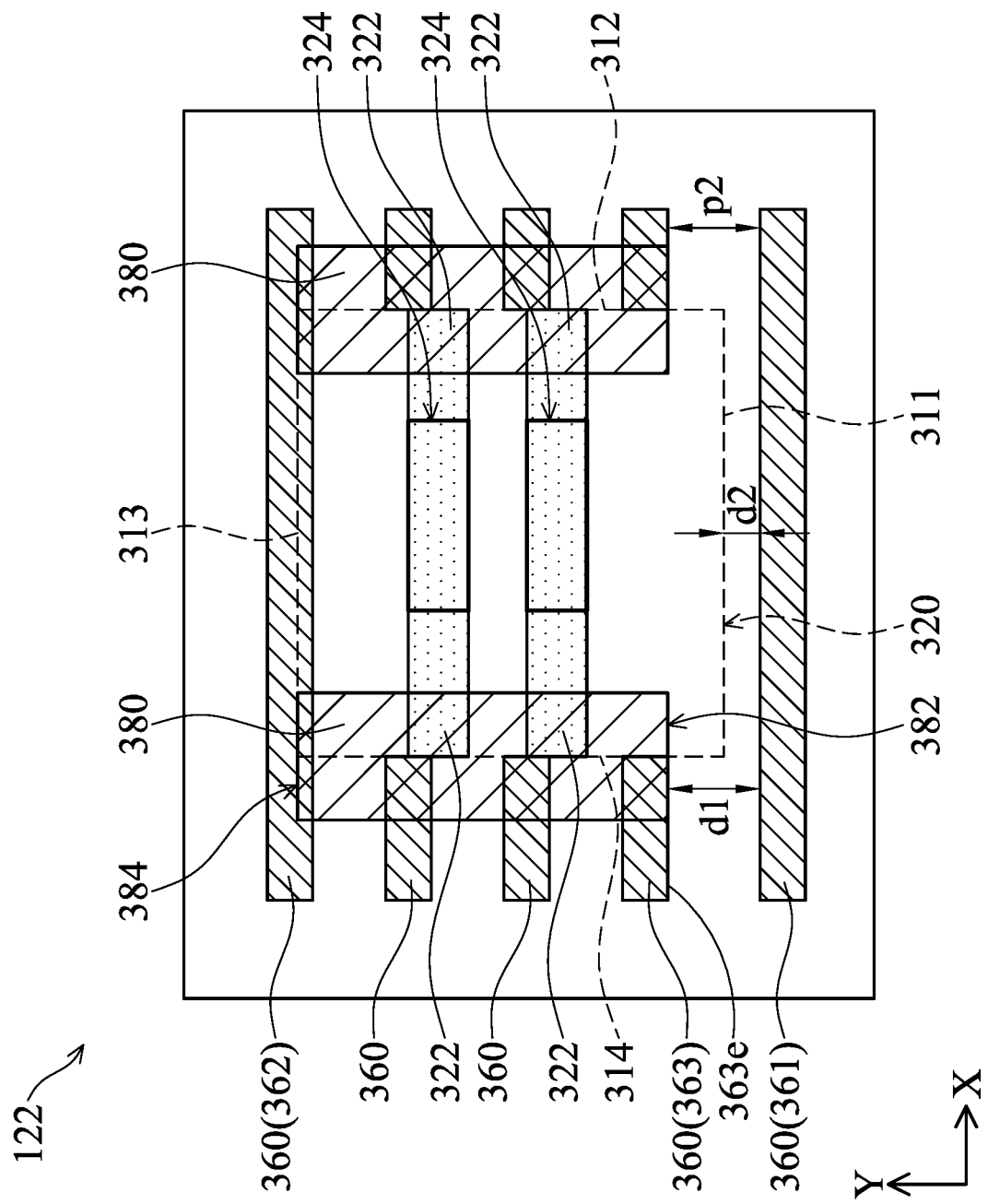

FIG. 5, FIG. 6, and FIG. 7 illustrate modified IC design layouts according to the method shown in FIG. 3, according to various aspects of the present disclosure. At operation 204, referring to FIG. 3 and FIG. 5, the method 200 extends the lengths of the device patterns 324 in the layout block 320 to form extended device patterns 322. The extended lengths are such designed that rounding ends of the extended device patterns 322 after patterning are limited to the extended lengths, and the extended device patterns 322 after cutting the rounding ends are substantially the same as the device patterns 324.

At operation 206, referring to FIG. 3 and FIG. 6, the method 200 adds extended dummy patterns (e.g., second line patterns) 360 to the spaces outside the layout block 320. The extended dummy patterns 360 are configured to undergo the same processes as the device patterns 324 during which the extended dummy patterns 360 are transferred to a fin structure and subsequently cut (or shortened, trimmed) by using the cut pattern to form dummy fins. The dummy fins are used to, among other purposes, avoid empty spaces and improve the uniformity and/or pattern density for subsequent processes (e.g., chemical mechanical planarization (CMP) and/or etching processes). The dummy fins are subsequently removed after completing required processes for the device regions.

In the present embodiments, the extended dummy patterns 360 fills the empty spaces of the IC design layout 122 outside the layout block 320 and contacting the vertical edges (along Y direction) of the layout block 320. In other words, the extended dummy patterns 360 surrounds (or embeds) the layout block 320. In some embodiments, the horizontal edges (along X direction) of the layout block 320 may fall into spaces between adjacent extended dummy patterns 360 or within an extended dummy pattern 360. The extended dummy patterns 360 are disposed parallel to the device patterns 324 and lengthwise along X direction. The extended dummy patterns 360 have uniform line width w2 and line pitches p2. In the present embodiments, the line width w2 is less than the line width w1 of the device patterns 324, respectively. In this embodiment, one of the extended dummy patterns 360 (e.g. upper dummy pattern 362, or referred to as third line pattern 362) overlaps the third edge 313 of the layout block 320, and another one of the extended dummy patterns 360 (e.g. lower dummy pattern 361) is separated from the first edge 311 of the layout block 320, but the present disclosure is not limited thereto. The position of the extended dummy patterns 360 may be adjusted based on actual requirement.

At operation 208, referring FIG. 3 and FIG. 7, the method 200 forms mandrel bar patterns 380 between the extended device patterns 322 inside the layout block 320 and the extended dummy patterns 360 outside the layout block 320. In some embodiments, the mandrel bar pattern 380 has a first end 382 and a second end 384 opposite from the first end 382. In some embodiments, the length the mandrel bar pattern 380 is less than the length of the second edge 312. In some embodiments, the mandrel bar pattern 380 is designed to be separated from the extended dummy pattern 360 that is outside the layout block 320 and closest to the first edge 311 or the third edge 313 but not overlaps the first edge 311 or the third edge 313, such as the lower dummy pattern 361. In some embodiments, the first end 382 is separated from the lower dummy pattern 361 for a distance d1. It should be noted that the first end 382 does not overlap the first edge 311 of the layout block 320, and is between the first edge 311 and the third edge 313. In some embodiments, the mandrel bar pattern 380 is designed to overlap the extended dummy pattern 360 that overlaps the first edge 311 or the third edge 313, such as the second end 384 overlaps the upper dummy pattern 362, but the present disclosure is not limited thereto.

In some embodiments, the distance d1 between the first end 382 and the lower dummy pattern 361 is substantially identical to the line pitch p2 between two extended dummy patterns 360. In other words, the first end 382 may be aligned with a side edge 363e of the extended dummy pattern 360 that is closest to the first edge 311 and the lower dummy pattern 361 (e.g. extended dummy pattern 363), and the extended dummy pattern 363 connects to the second edge 312 or the fourth edge 314 of the layout block 320. It should be noted that the distance d1 between the first end 382 and the lower dummy pattern 361 that is spaced apart from the layout block 320 is greater than the distance d2 between the first edge 311 and the lower dummy pattern 361 that is spaced apart from the layout block 320. In some embodiments, if the distance between the lower dummy pattern 361 and the extended device pattern 322 closest to the lower dummy pattern 361 is less than the distance between the extended dummy pattern 363 and the lower dummy pattern 361 (such as the embodiment shown in FIG. 12B), the first end 382 will be designed to align with the side edge of the extended device pattern 322 closest to the lower dummy pattern 361. In other words, the ends of the mandrel bar pattern 380 may be designed to align with either the side edge of the dummy pattern 360 or the side edge of the extended device pattern 322, as long as it is the closest pattern to the lower dummy pattern 361 that does not overlap the edges of the layout block 320 (same rule also applies to the upper dummy pattern 362 if the upper dummy pattern 362 does not overlap the edges of the layout block 320). Therefore, the minimum space between the patterns will be enlarged prevent mandrel space violation.

At operation 210, referring to FIG. 2 and FIG. 3, the method 200 outputs layout data for mask fabrication. In an embodiment, the layout data includes a mandrel pattern layout and a cut pattern layout. The mandrel pattern layout is used to pattern the substrate to form a mandrel structure. The mandrel structure is later subjected to a cutting process using a mask corresponding to the cut pattern layout, thereby removing portions of the mandrel structure to form the final structure, such as a fin structure. Further, each of the mandrel pattern layout and the cut pattern layout may also include certain assist features, such as those features for imaging effect, processing enhancement, and/or mask identification information. In some embodiments, operation 210 outputs the mandrel pattern layout and the cut pattern layout in a computer-readable format for subsequent fabrication stage. For example, the layouts may be outputted in GDSII, DFII, CIF, OASIS, or any other suitable file format.

At operation 212, referring to FIG. 3, the method 200 manufactures a first mask with the mandrel pattern layout and a second mask with the cut pattern layout. Operation 212 may manufacture other masks for various layers and features of the IC 150. In some embodiments, the first mask and the second mask may be transmissive masks (e.g., for deep ultraviolet lithography) or reflective masks (e.g., for extreme ultraviolet lithography), and may include imaging enhancement features such as phase shifting. In embodiments where maskless lithography, such as e-beam direct writing, is used, operation 212 is bypassed or involves data preparation for the particular direct writer without fabricating an actual mask.

In some embodiments, the first mask carries the mandrel pattern layout including the extended device patterns (first line patterns) 322 in the layout block 320 along X direction, the extend dummy patterns (second line patterns) 360 outside the layout block 320 along X direction, and the mandrel bars 380 disposed between and connecting the extended device patterns 322 and the extend dummy patterns 360 along Y direction perpendicular to X direction.

Figure 8A:
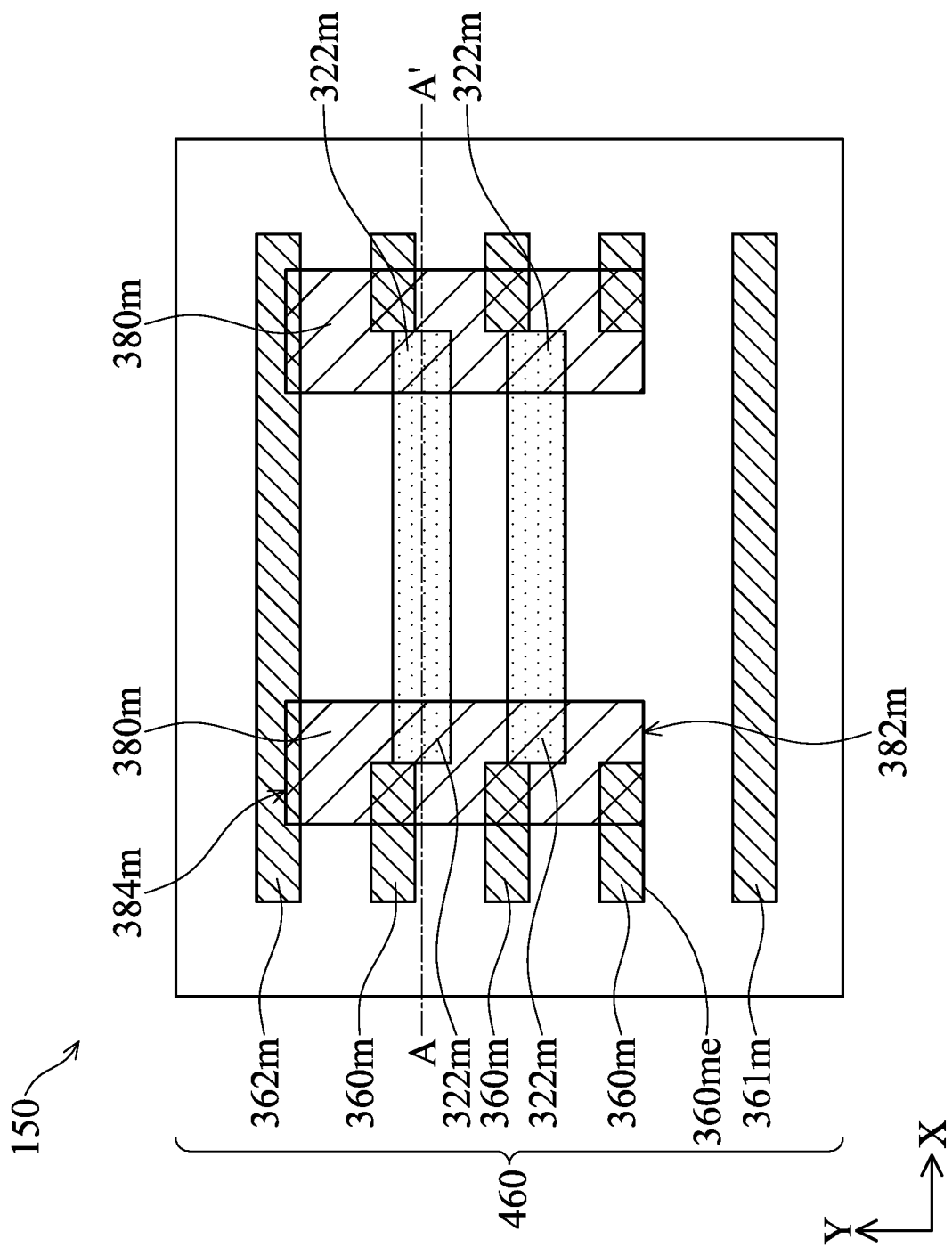
Figure 8C:
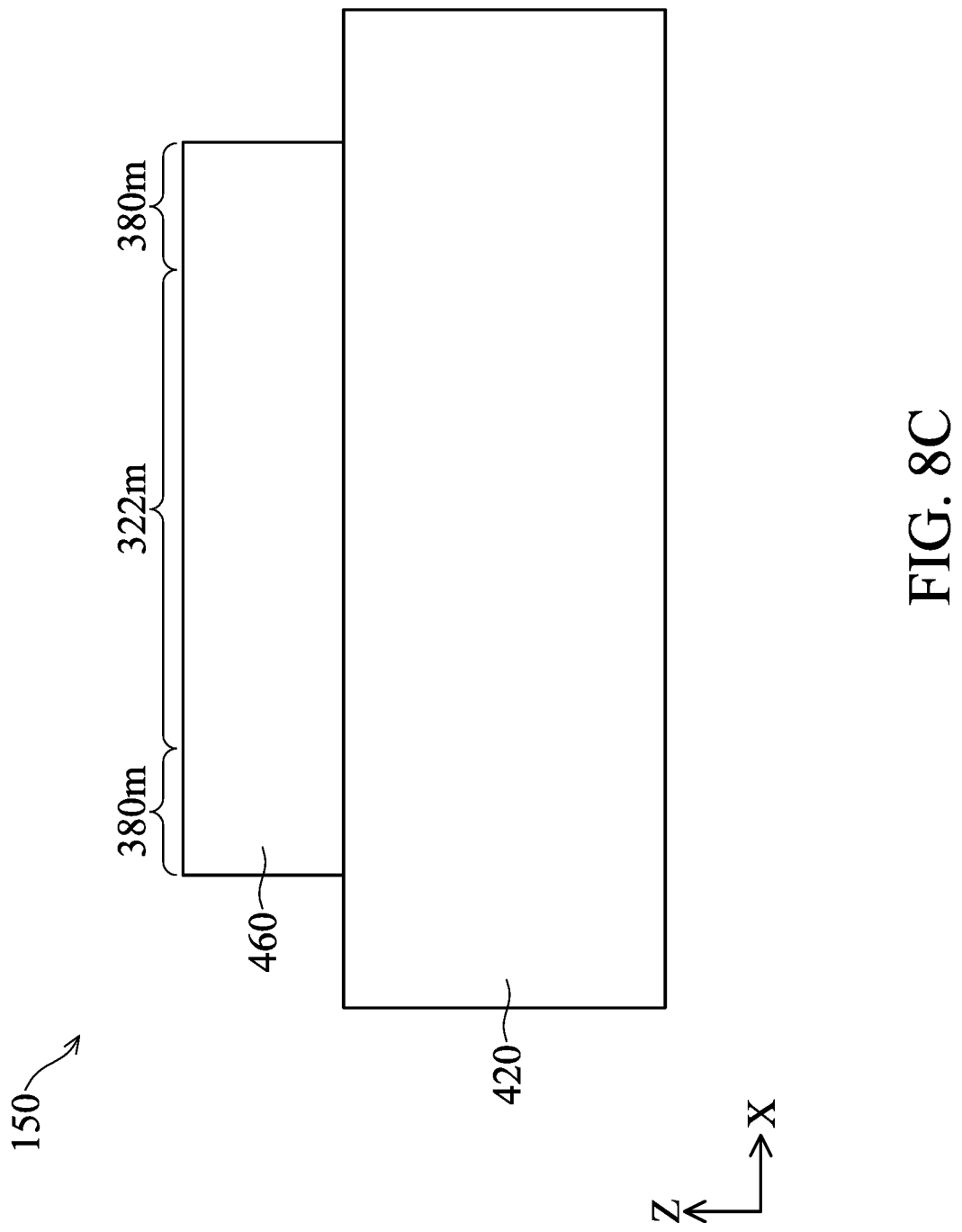

FIG. 8A, FIG. 8B, FIG. 8C, FIG. 9A, FIG. 9B, FIG. 10A, FIG. 10B, FIG. 11A, and FIG. 11B illustrate top view or cross-sectional view of an IC in various manufacturing steps of the method shown in FIG. 3, according to various aspects of the present disclosure. At operation 214, referring to FIG. 3, FIG. 8A, FIG. 8B, and FIG. 8C, the method 200 patterns a substrate 420 (such as a wafer) with the first mask to fabricate a mandrel structure 460 on the IC 150. The FIG. 8B and FIG. 8C are cross-sectional views of the IC 150 at intermittent steps along line A-A' in FIG. 8A. The operation 214 involve one or more lithography patterning and etching steps. In various embodiments, operation 214 may pattern the substrate 420 with or without using a spacer technique. In the present embodiments, the mandrel structure is directly used to pattern the fin structure without using spacers. The operation 214 is merely an example for illustrating various aspects of the provided subject matter. Additional operations can be provided before, during, and after the operation 214, and some operations described can be replaced, eliminated, or moved around for additional embodiments of the method 200.

Prior to the pattering of the substrate 420, referring to FIG. 8B, a dielectric layer 440 is deposited over the substrate 420 (e.g., a semiconductor wafer). In various embodiments, the substrate 420 may include one or more elementary semiconductor, such as germanium; a compound semiconductor, such as silicon carbide, indium arsenide, or indium phosphide; or an alloy semiconductor, such as silicon germanium carbide, gallium arsenic phosphide, or gallium indium phosphide. The substrate 420 includes silicon in the present embodiment. Materials suitable for the dielectric layer 440 include, but not limited to, silicon oxide, silicon nitride, poly-silicon, $Si_3N_4$, SiON. TEOS, nitrogen-containing oxide, nitride oxide, high-k materials, or combinations thereof. The dielectric layer 440 may include multiple layers and may be formed by one or more deposition techniques, such as thermal oxidation, chemical vapor deposition (CVD), and physical vapor deposition (PVD).

Referring to FIG. 8A and FIG. 8C, the method 200 then patterns the dielectric layer 440 to form a mandrel structure 460 over the substrate 420 using the first mask. The mandrel structure 460 includes multiple mandrel lines connected together as shown in FIG. 8A, such as device mandrel lines 322m corresponds to the extended device patterns 322 in the layout block 320 (FIG. 6), dummy mandrel lines 360m corresponded to the extended dummy patterns 360 outside the layout blocks 320 (including a lower dummy mandrel line 361m and a upper dummy mandrel line 362m), and the mandrel bars 380m correspond to the mandrel bar patterns 380 that bridges the device mandrel lines 322m with the adjacent dummy mandrel lines 360m. The device mandrel lines 322m and the dummy mandrel lines 360m are oriented lengthwise along the X direction, while the mandrel bars 380m are each oriented lengthwise along a respective direction different from the X direction, such as the Y direction.

The mandrel structure 460 is formed by patterning the dielectric layer 440 with a procedure including a lithography process and an etching process. For example, a photoresist (or resist) layer (not shown) is formed on the dielectric layer 440 using a spin-coating process and soft baking process. Then, the photoresist layer is exposed to a radiation using the first mask manufactured in the operation 212. The exposed photoresist layer is developed using post-exposure baking, developing, and hard baking thereby forming a patterned photoresist layer over the dielectric layer 440. Subsequently, the dielectric layer 440 is etched through the openings of the patterned photoresist layer, forming the mandrel structure 460. The etching process may include a dry (or plasma) etching, a wet etching, or other suitable etching methods. The patterned photoresist layer is removed thereafter using a suitable process, such as wet stripping or plasma ashing. During the above photolithography process, the density and uniformity of the mandrel structure 460, including device mandrel lines 322m, dummy mandrel lines 360m, and mandrel bars 380m help improve pattern critical dimension uniformity in view of optical proximity effect.

Since the device mandrel lines 322m, the dummy mandrel lines 360m, and the mandrel bar patterns 380m correspond to the extended device patterns 322, the extended dummy patterns 360, and the mandrel bar patterns 380, respectively, the resulting mandrel bar pattern 380m also has a first end 382m and a second end 384m that have similar position to the first end 382 and the second end 384 of the mandrel bar pattern 380. For example, in some embodiments, the first end 382m aligns with a side edge 360me of the dummy mandrel line 360m that is closest to the lower dummy mandrel line 361m, and the second end 384m overlaps the upper dummy mandrel line 362m. Therefore, the lower dummy mandrel line 361m and the mandrel bar patterns 380m have a space large enough to prevent mandrel space violation.

Figure 9A:
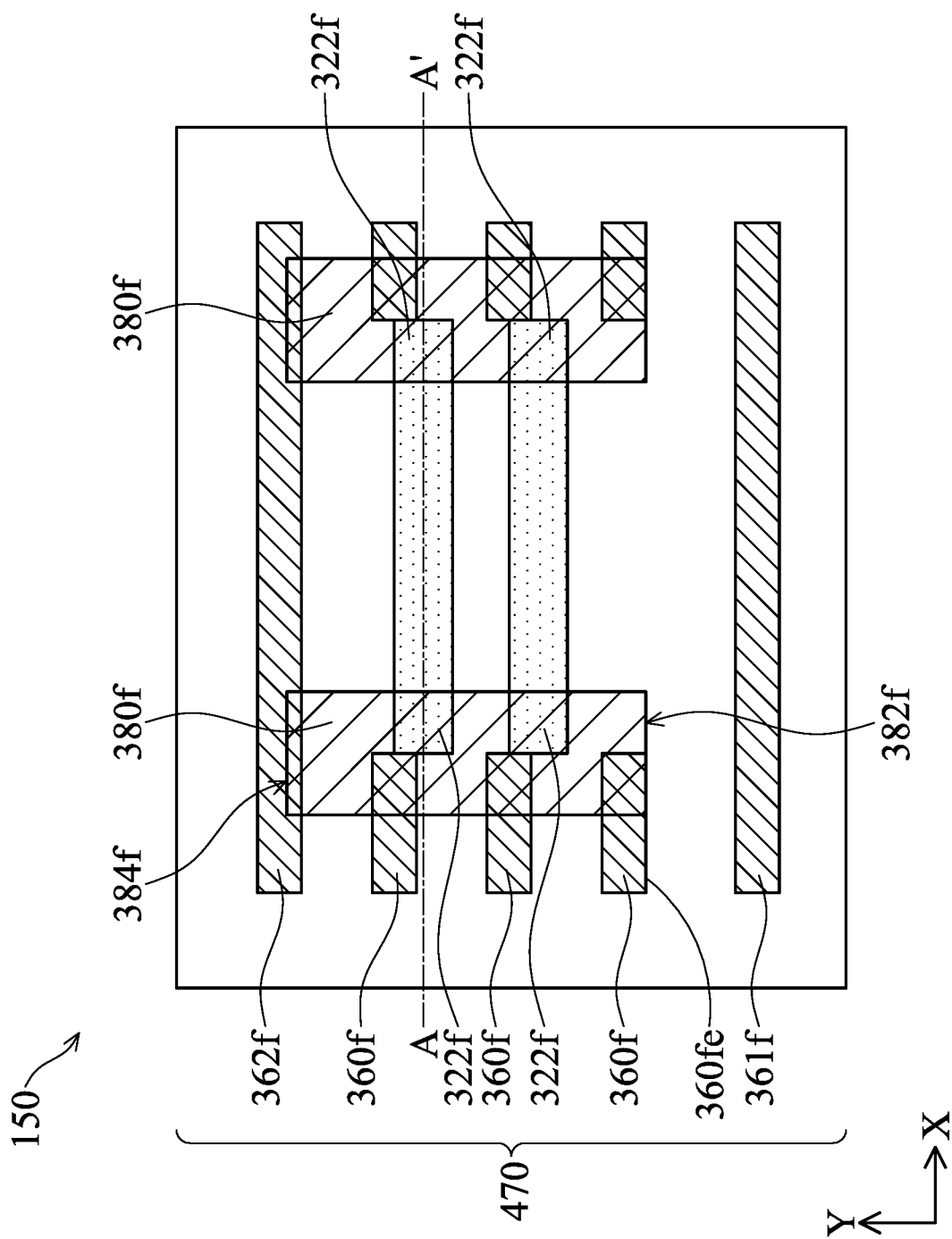
Figure 9B:
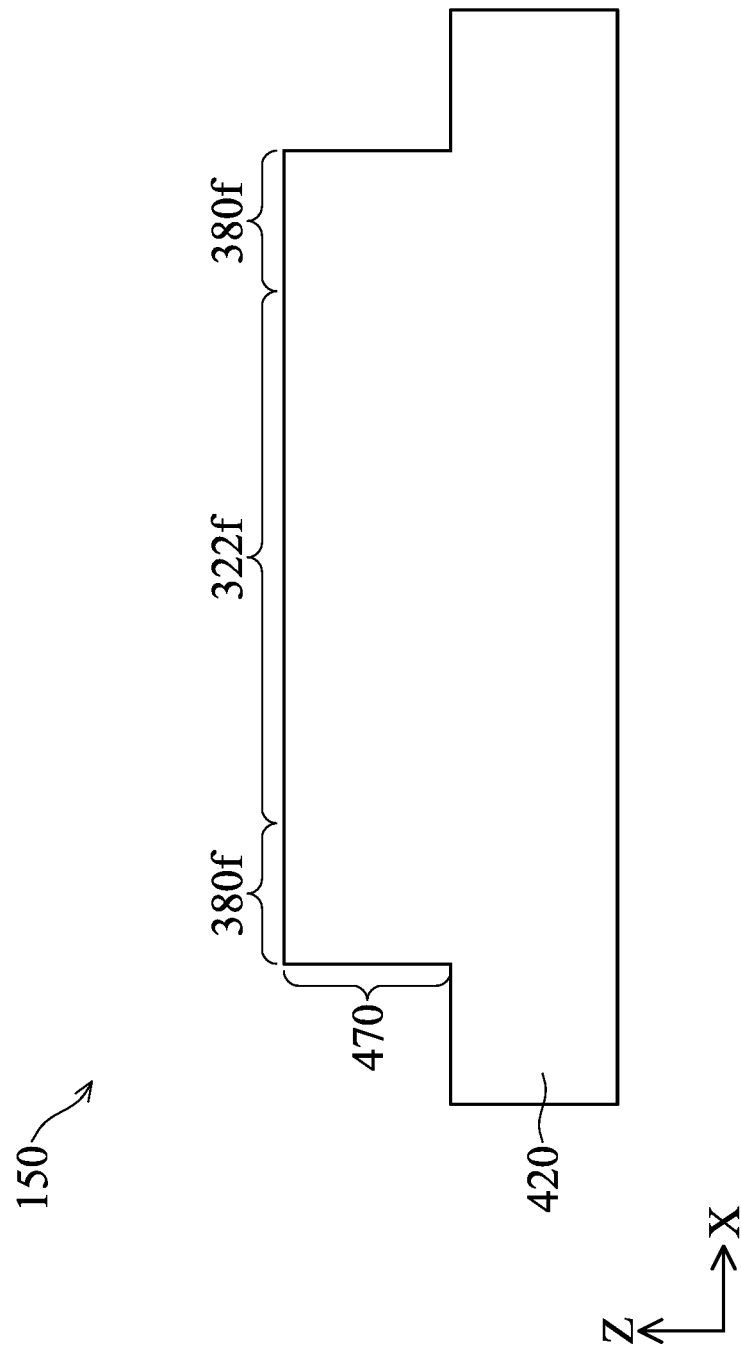

At operation 216, referring FIG. 3, FIG. 9A, and FIG. 9B, the method 200 etches the substrate 420 to form a fin structure 470 including multiple continuous fin lines in the substrate 420 using the mandrel structure 460 as an etch mask. The fin structure 470 carry the same patterns as the mandrel structure 460. In other words, the first mask, the mandrel structure 460, and the fin structure 470 have the same pattern. In the present embodiments, the continuous fin lines include device fin lines 322f corresponding to the device mandrel lines 322m, the dummy fin lines 360f corresponding to the dummy mandrel lines 360m, and the fin bars 380f corresponding to the mandrel bars 380m. The device fin lines 322f corresponding to the extended device patterns 322 in the same line are connected together similar as the device mandrel lines 322m in the mandrel structure 460. The device fin lines 322f are connected to the dummy fin lines 360f by the fin bars 380f corresponding to the mandrel bar patterns 380. The etching process can be a wet etching, a dry etching, or a combination thereof. The mandrel structure 460 is subsequently removed.

Since the device fin lines 322f, the dummy fin lines 360f, and the fin bars 380f corresponds to the device mandrel lines 322m, the dummy mandrel lines 360m, and the mandrel bar patterns 380m, respectively, the resulting fin bar 380f also has a first end 382f and a second end 384f that have similar position to the first end 382m and the second end 384m of the mandrel bar patterns 380m. For example, in some embodiments, the first end 382f aligns with a side edge 360fe of the dummy fin lines 360f that is closest to a lower dummy fin line 361f, and the second end 384f overlaps the upper dummy fin line 362f. Therefore, the lower dummy fin line 361f and the fin bars 380f have a space large enough to prevent mandrel space violation.

Figure 10A:
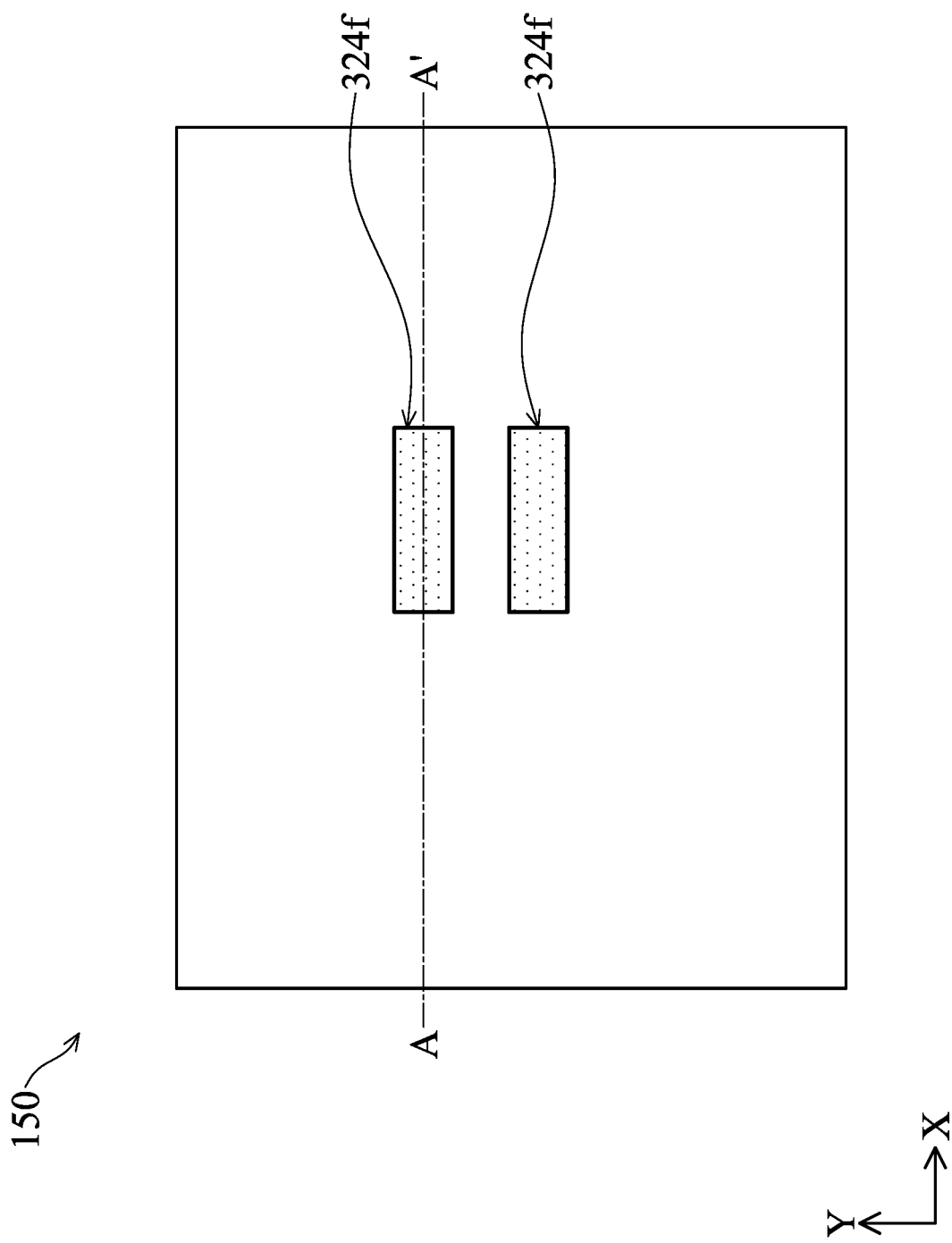
Figure 10B:
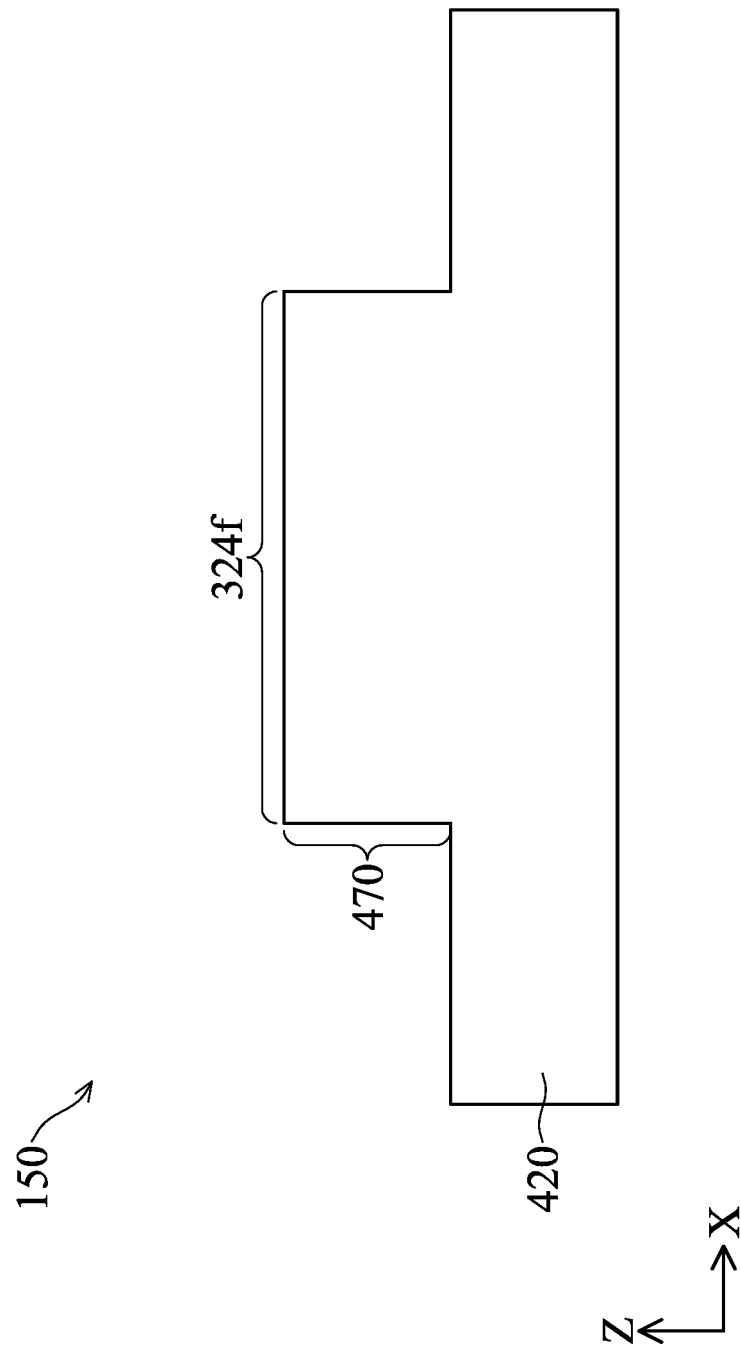

At operation 218, referring to FIG. 3, FIG. 10A, and FIG. 10B, the method 200 performs a fin cut process with the second mask manufactured in the operation 214. The portions of the fin line covered by the cut patterns (cut regions) are substantially removed. In the present embodiment, the fin cut process includes a lithography process and an etching process. For example, a photoresist layer (not shown) is formed on the substrate 420 using a spin-coating process and soft baking process. Then, the photoresist layer is exposed to a radiation using the second mask manufactured in the operation 214. The exposed photoresist layer is subsequently developed and stripped thereby forming a patterned photoresist layer. The portions of the continuous fin lines corresponding to the extended portions of the device mandrel lines 322m, the dummy mandrel lines 360m, and the mandrel bar 380m are removed by the patterned photoresist layer. The portions of the continuous fin line corresponding to the device patterns 324 is protected by the patterned photoresist layer to form device fins 324f. Subsequently, the continuous fin lines are etched through the openings of the patterned photoresist layer. The patterned photoresist layer is removed thereafter using a suitable process, such as wet stripping or plasma ashing. In an embodiment, the operation 218 may also remove the lower dummy fin line 361f and the upper dummy fin line 362f.

Figure 11A:
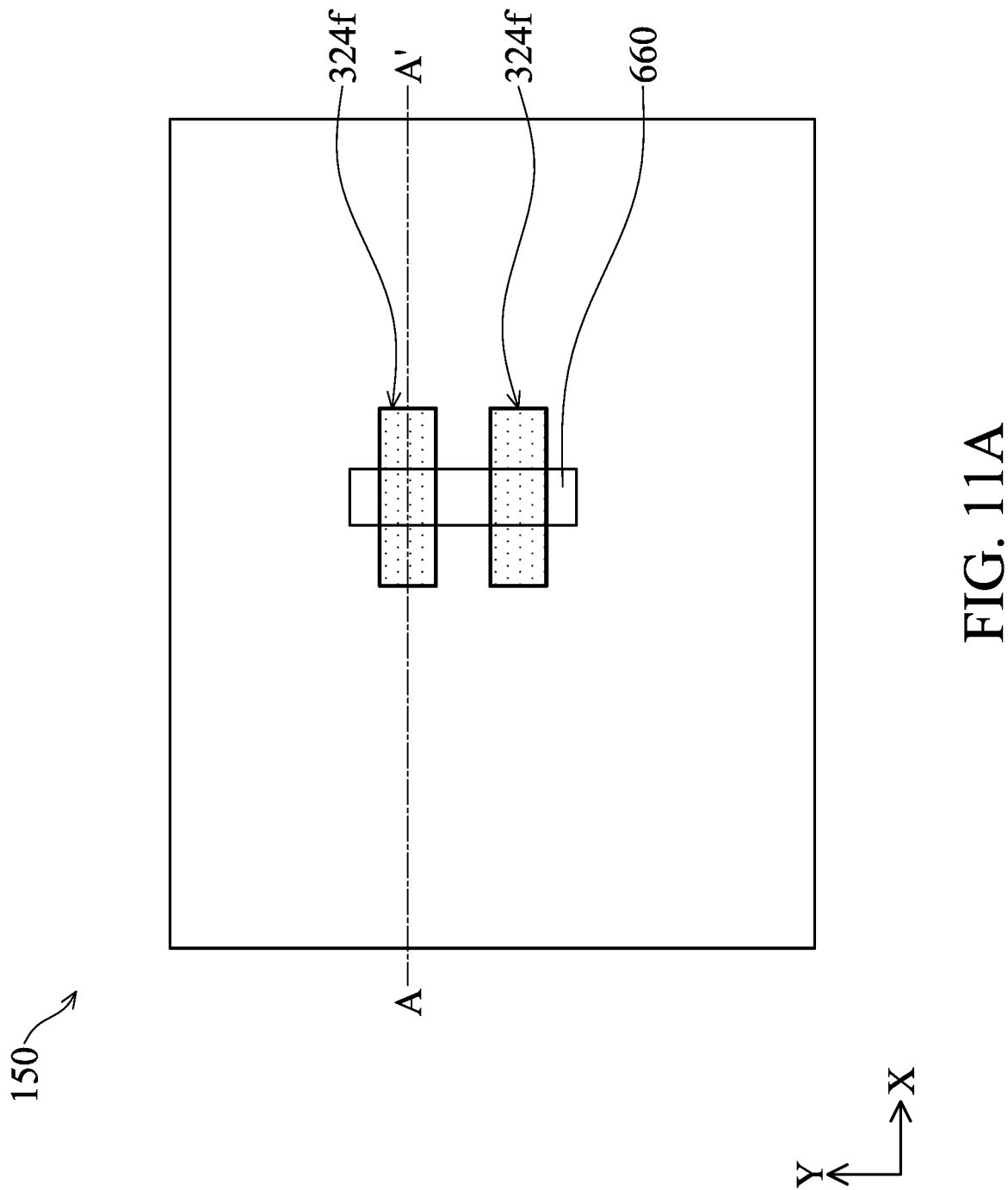
Figure 11B:
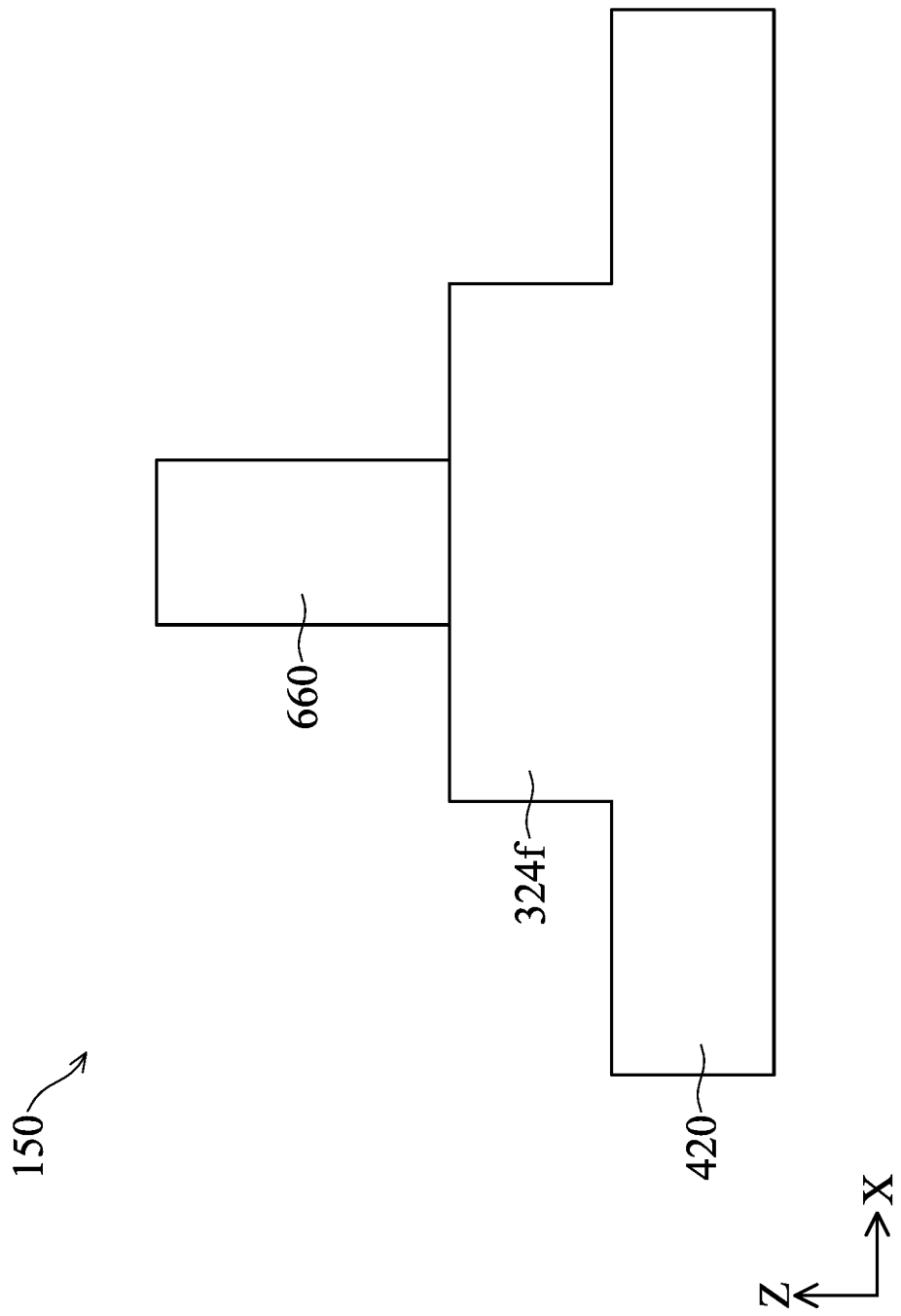

At operation 220, referring to FIG. 3, FIG. 11, and FIG. 11B, the method 200 performs further processes to complete the fabrication of the final IC 150. For example, the operation 220 may form isolation structures (not shown) to electrically isolate the various fins. In some embodiments, the operation 220 forms the isolation feature 600 by depositing a dielectric material such as silicon oxide over the substrate 420 and then etches back the dielectric material. In some embodiments, portions of the device fins protruding above the isolation feature provide source, drain, and channel regions for FinFETs.

The operation 220 may also form a gate stack 660 over the device fins 324f using a gate-first process or a gate-last process. Thereafter, the operation 220 may form source and drain regions (not shown) in the fins using ion implantation, epitaxial growth, and/or other suitable methods. Other processes include forming source and drain contacts, forming gate contacts, and forming via and metal interconnects, and so on.

Figure 12A:
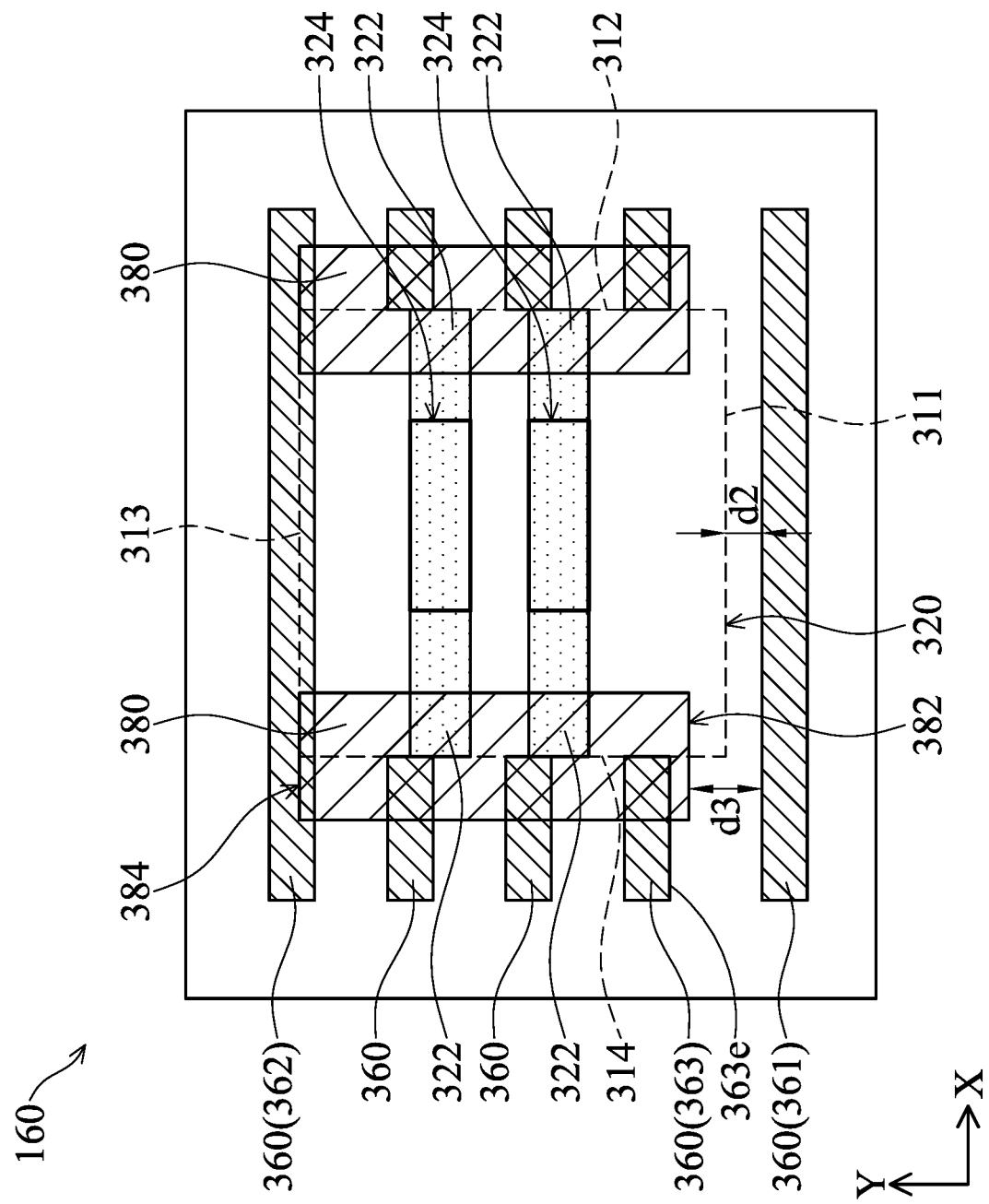
FIG. 12A illustrates a modified IC design layout according to the method shown in FIG. 3, in some embodiments of the present disclosure.

Although FIG. 7 shows one of the IC design layout in some embodiments, the present disclosure is not limited thereto. For example, FIG. 12A illustrates a modified IC design layout 160 according to the method shown in FIG. 3, in some embodiments of the present disclosure. The difference between the IC design layout 122 and the IC design layout 160 is that the first ends 382 of the mandrel bar patterns 380 do not align with the side edge 363e of the dummy pattern 363 that is closest to the lower dummy pattern 361. Instead, the first ends 382 are positioned between the first edge 311 and the side edge 363e of the dummy pattern 363, and the distance d3 between the first ends 382 and the lower dummy pattern 361 is greater than the distance d2 between the first edge 311 and the lower dummy pattern 361. In some embodiments, the mandrel bar pattern 380 is between the first edge 311 and the third edge 313. Therefore, the minimum space between the patterns will be enlarged to prevent mandrel space violation.

Figure 12B:
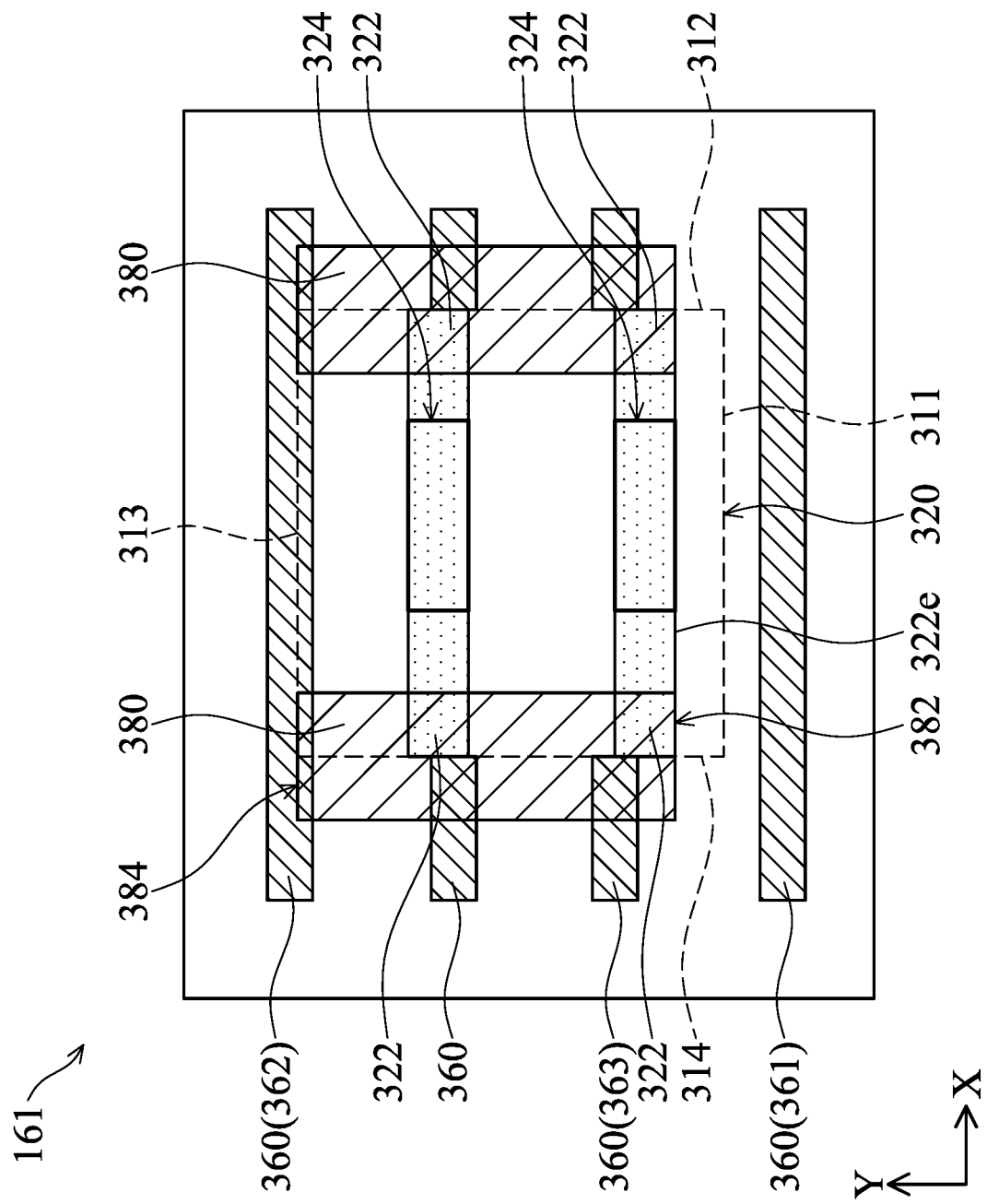
FIG. 12B illustrates a modified IC design layout according to the method shown in FIG. 3, in some embodiments of the present disclosure.

FIG. 12B illustrates a modified IC design layout 161 according to the method shown in FIG. 3, in some embodiments of the present disclosure. In some embodiments, the extended device patterns 322 is closer to the first edge 311 than the extended dummy pattern 360 that connects to the second edge 312 or the fourth edge 314. Therefore, the mandrel bar patterns 380 are shrink to let the first end 382 align with a side edge 322e of the extended device patterns 322. Therefore, the minimum space between the patterns will be enlarged to prevent mandrel space violation.

Figure 12C:
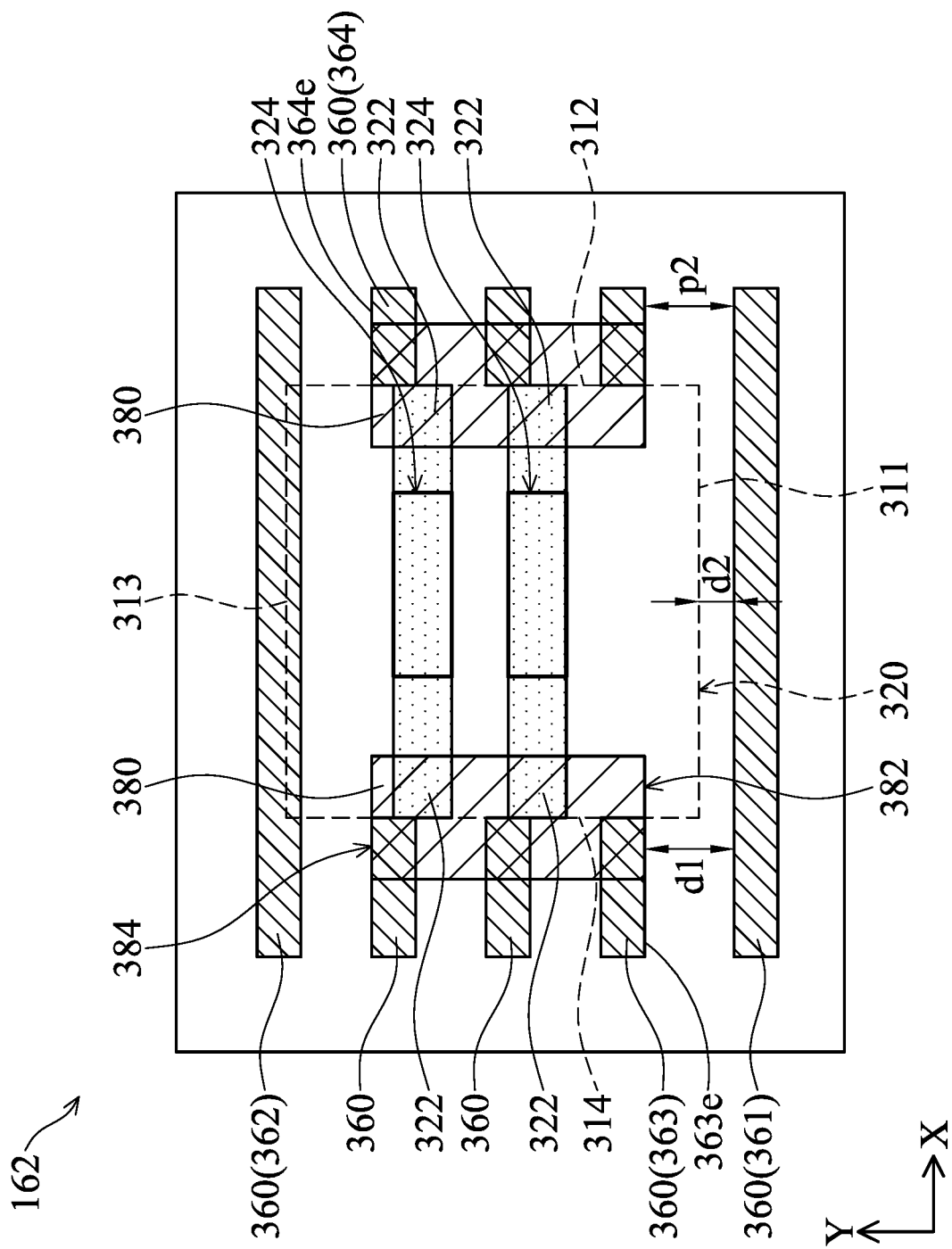
FIG. 12C illustrates a modified IC design layout 162 according to the method shown in FIG. 3, in some embodiments of the present disclosure.

FIG. 12C illustrates a modified IC design layout 162 according to the method shown in FIG. 3, in some embodiments of the present disclosure. As shown in FIG. 12C, the second end 384 of the mandrel bar pattern 380 does not overlap (i.e. spaced apart from) the upper dummy pattern 362. Furthermore, the second end 384 aligns with a side edge 364e of the extended dummy pattern 360 that is closest to the third edge 313 and the upper dummy pattern 362 (e.g. extended dummy pattern 364). In some embodiments, the extended dummy pattern 364 is adjacent to the third edge 313 (i.e. no other extended dummy pattern 360 is between the extended dummy pattern 364 and the third edge 313), and is separated from the third edge 313. In other words, the first end 382 and the second end 384 may be between the first edge 311 and the third edge 313, and respectively align with a side edge of the extended device pattern 322 or the extended dummy pattern 360 that is closest to the first edge 311 or the third edge 313, so the space between the first end 382 (or the second end 384) to a closest pattern may be enlarged to facilitate subsequent processes.

Figure 13A:
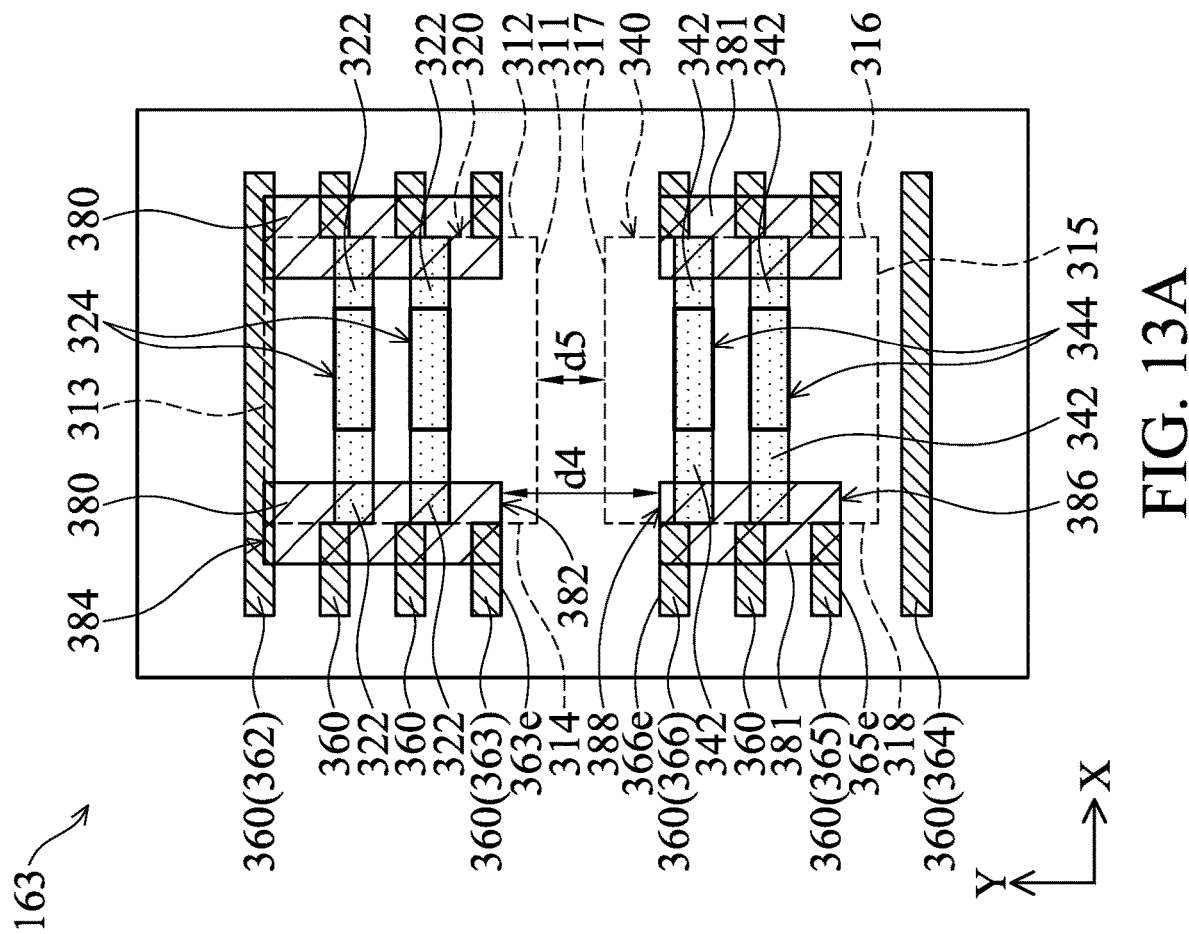
FIG. 13A illustrates a modified IC design layout according to the method shown in FIG. 3, in some embodiments of the present disclosure.

FIG. 13A illustrates a modified IC design layout 163 according to the method shown in FIG. 3, in some embodiments of the present disclosure. The IC design layout 163 includes layout blocks 320 and 340 (also referring to a first layout block 320 and a second layout block 340) separated from each other and arranged in the Y direction. For example, similar to the first layout block 320, the second layout block 340 also includes device patterns 344 and extended device patterns 342 (third line patterns) extending from the device patterns 344 in the X direction. Extended dummy patterns 360 (also referred as fourth line patterns when surrounding the second layout block 340) are also added outside the layout block 340, and a second mandrel bar pattern 381 having a third end 386 and a fourth end 388 are added to overlap the extended device patterns 342 and the extended dummy patterns 360 for connecting the patterns. The second layout block 340 may include a fifth edge 315, a sixth edge 316, a seventh edge 317, and an eighth edge 318 sequentially connected to each other. In some embodiment, the fifth edge 315 and the sixth edge 316 may be parallel and extending along a first direction (e.g. the X direction), and the seventh edge 317 and the eighth edge 318 may be parallel and extending along a second direction (e.g. the Y direction). In some embodiments, the first mandrel bar pattern 380 and the second mandrel bar pattern 381 are arranged in the second direction.

In some embodiments, the minimum pattern distance between the first layout block 320 and the second layout block 340 in the Y direction is the distance d4 between the mandrel bar pattern 380 (referred to the first mandrel bar pattern 380 in this embodiment) and the second mandrel bar pattern 381, such as the distance between the first end 382 of the first mandrel bar pattern 380 and the fourth end 388 of the second mandrel bar pattern 381. In some embodiments, the distance d4 is greater than the distance d5 between the first edge 311 of the layout block 320 and the seventh edge 317 of the layout block 340. Therefore, the space between the patterns in different layout blocks (e.g. the first layout block 320 and the second layout block 340) may be enlarged to prevent mandrel space violation.

In some embodiments, the second end 384 of the first mandrel bar pattern 380 overlaps the upper dummy pattern 362. In some embodiments, the third end 386 of the second mandrel bar pattern 381 is separated from the lower dummy pattern 364, such as the third end 386 may align with a side edge 365e of the extended dummy pattern 365 that is closest to the lower dummy pattern 364. Alternatively, the third end 386 may position between the side edge 365e of the extended dummy pattern 365 and the third edge 315 of the layout block 340 in some embodiments, depending on design requirement. In some embodiments, the fourth end 388 of the second mandrel bar pattern 381 opposite to the third end 386 is aligned with a side edge of another one of the extended device patterns 342 (third line patterns 342) or the extended dummy patterns 360 (fourth line patterns 360), such as a side edge 366e of the extended dummy pattern 366.

Figure 13B:
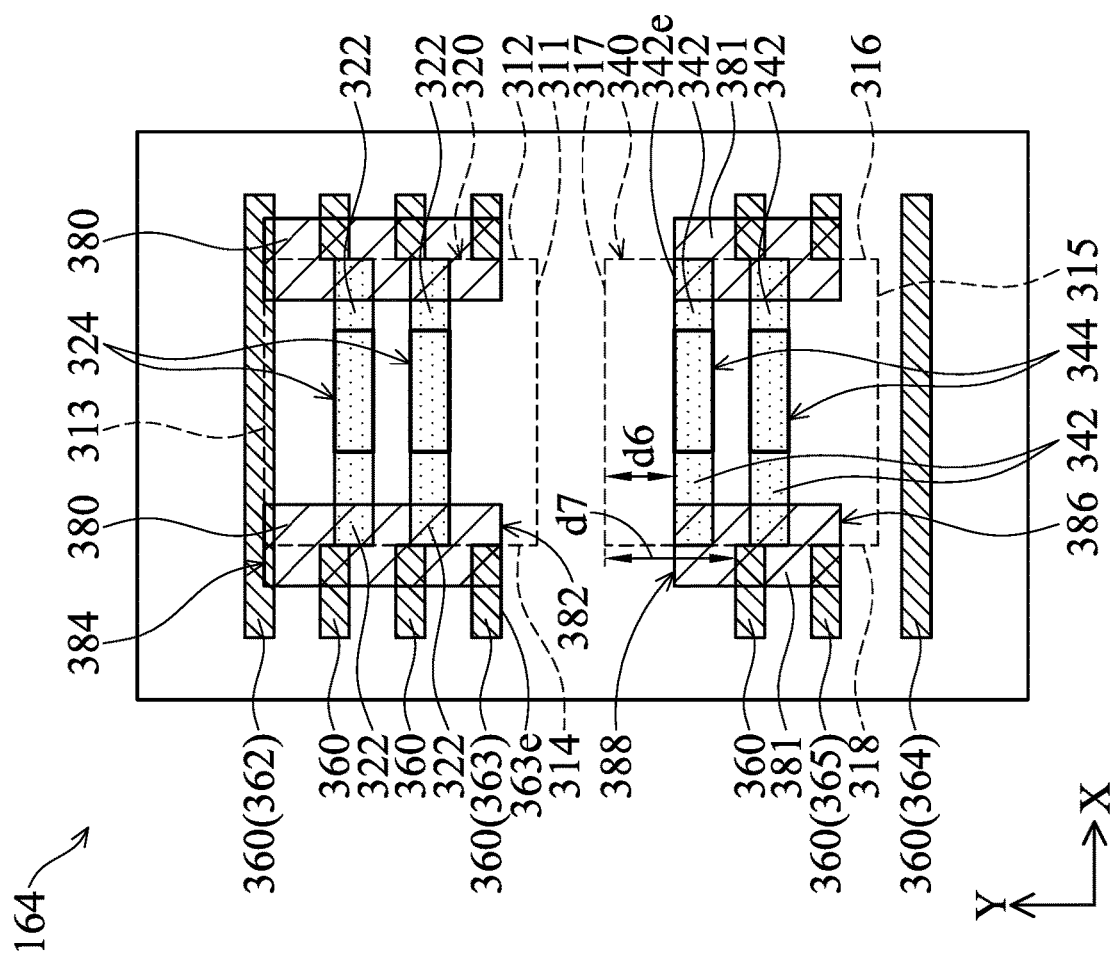
FIG. 13B illustrates a modified IC design layout according to the method shown in FIG. 3, in some embodiments of the present disclosure.

FIG. 13B illustrates a modified IC design layout 164 according to the method shown in FIG. 3, in some embodiments of the present disclosure. In some embodiments, the modified IC design layout 164 may be similar to the modified IC design layout 163 shown in FIG. 12B, and the difference is that a distance d6 between the extended device pattern 342 (i.e. the third line pattern) and the seventh edge 317 is less than a distance d7 between the extended dummy pattern 360 (i.e. the fourth line pattern) and the seventh edge 317. Therefore, the fourth end 388 may align with a side edge 342e of the extended device pattern 342 instead of aligns with the extended dummy pattern 360 in some embodiments.

It should be noted that no extended dummy pattern 360 is formed between the first layout block 320 and the second layout block 340 in FIG. 13A and FIG. 13B, the present disclosure is not limited thereto. For example, in some embodiments, additional extended dummy pattern 360 may be formed between the first layout block 320 and the second layout block 340, depending on design requirement.

Figure 14:
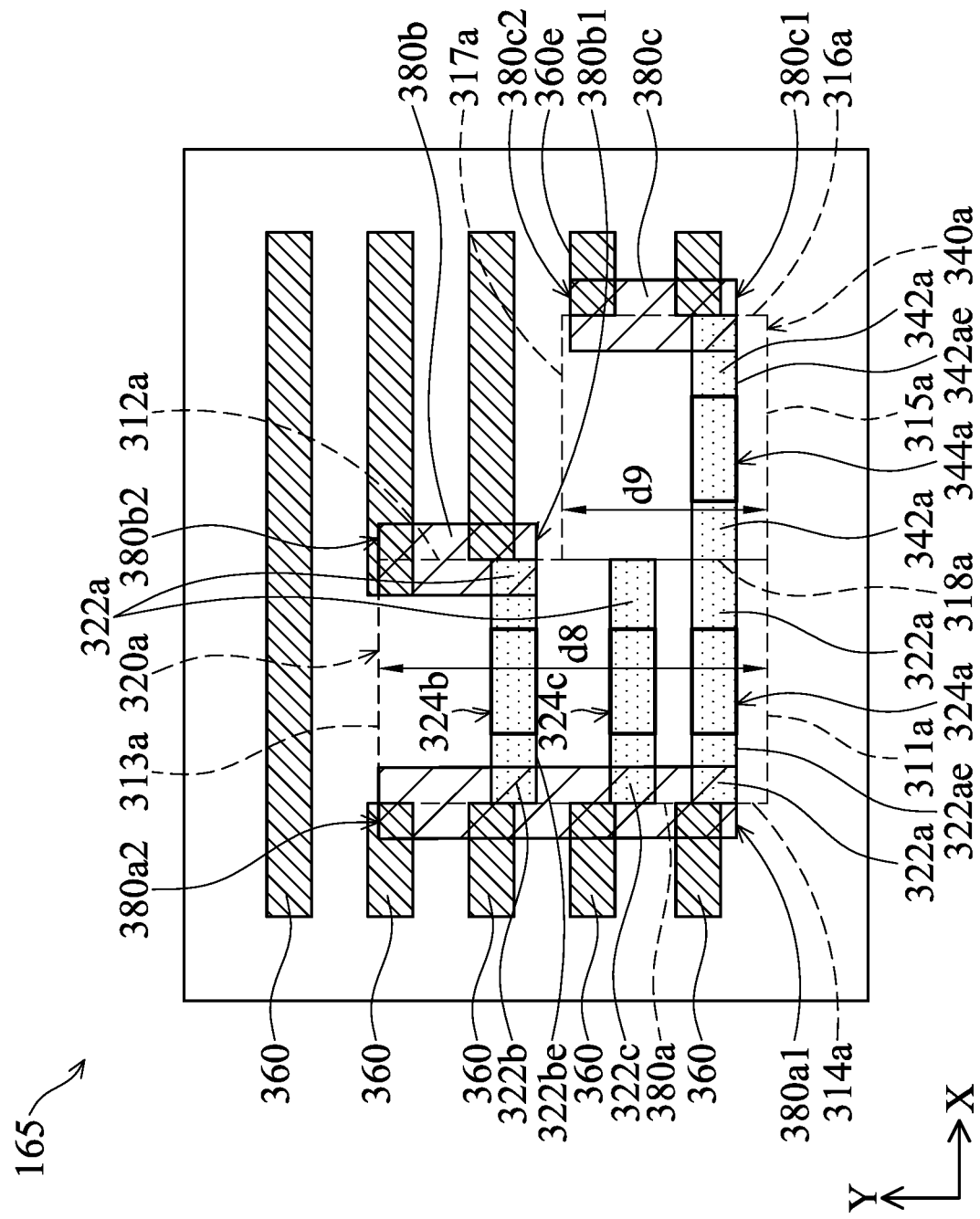
FIG. 14 illustrates a modified IC design layout according to the method shown in FIG. 3, in some embodiments of the present disclosure.

FIG. 14 illustrates a modified IC design layout 165 according to the method shown in FIG. 3, in some embodiments of the present disclosure. In some embodiments, the IC design layout 165 includes a first layout block 320a and a second layout block 340a arranged in the X direction. The first layout block 320a and the second layout block 340a may have different sizes, such as different sizes in the Y direction.

In some embodiments, the first layout block 320a includes a first edge 311a, a second edge 312a, a third edge 313a, and a fourth edge 314a. The first edge 311a and the third edge 313a extend in an identical direction, such as the X direction. In some embodiments, the second edge 312a and the fourth edge 314a extend in an identical direction, such as the Y direction. In some embodiments, the second layout block 340a includes a fifth edge 315a, a sixth edge 316a, a seventh edge 317a, and an eighth edge 318a. In some embodiments, the fifth edge 315a and the seventh edge 317a extend in an identical direction, such as the X direction. The sixth edge 316a and the eighth edge 318a extend in an identical direction, such as the Y direction. In some embodiments, the first edge 311a of the first layout block 320a aligns with the fifth edge 315a of the second layout block 340a. In some embodiments, a distance d8 between the first edge 311a and the third edge 313a is different from a distance d9 between the fifth edge 315a and the seventh edge 317a, such as a distance d8 may be greater than a distance d9. In some embodiments, the second edge 312a aligns the eighth edge 318a, such as the second edge 312a overlaps the eighth edge 318a. Therefore, some of the extended device patterns (e.g. extended device patterns 322a, 322b, 322c, or called first line patterns) may connect to some of the extended device patterns (e.g. extended device patterns 342a, or called as third line patterns) in some embodiments.

In some embodiments, the first layout block 320a includes device patterns 324a, 324b, 324c and extended device patterns 322a, 322b, 322c extending from the device patterns 324a, 324b, 324c to the second edge 312a and the fourth edge 314a. In some embodiments, the second layout block 340a includes a device pattern 344a and extended device patterns 342a extending from the device pattern 344a to the sixth edge 316a and the eighth edge 318a. In some embodiments, the extend device patterns 322a connects to the extended device patterns 342a In some embodiments, the extended device pattern 322a is misaligned with the extended device patterns 342a. In some embodiments, the extended device patterns 322a and the extended device patterns 342a extend in the X direction. In some embodiments, the IC design layout 165 further includes extended dummy patterns 360 extending in the X direction and surrounding the first layout block 320a and the second layout block 340a.

In some embodiments, the IC design layout 165 further includes a first mandrel bar pattern 380a, a second mandrel bar pattern 380b, an a third mandrel bar pattern 380c. In some embodiments, the first mandrel bar pattern 380a overlaps the extended dummy patterns 360, the fourth edge 314a, and the extended device patterns 322a, 322b, 322c. In some embodiments, the second mandrel bar pattern 380b overlaps the extended dummy patterns 360, the second edge 312a, the eighth edge 318a, and the extended device patterns 322a, 322b, 322c. In some embodiments, the third mandrel bar pattern 380c overlaps the extended dummy patterns 360, the sixth edge 316a, and the extended device pattern 342a. In some embodiments, the second mandrel bar pattern 380b and the second layout block 340a are arranged in the second direction (the Y direction). In some embodiments, the first mandrel bar pattern 380a, the second mandrel bar pattern 380b, and the third mandrel bar pattern 380c are different in length. For example, the length of the first mandrel bar pattern 380a may be greater than the length of the second mandrel bar pattern 380b or the length of the third mandrel bar pattern 380c.

In some embodiments, a first end 380a1 of the first mandrel bar pattern 380a aligns with a side edge 322ae of the extended device patterns 322a, which is the pattern (including the extended device patterns 322a, 322b, 322c, and the extended dummy patterns 360) closest to the first edge 311a. In some embodiments, a second end 380a2 of the first mandrel bar pattern 380a connects to the extended dummy patterns 360. Moreover, in some embodiments, the first end 380a1 is separated from the first edge 311a, so that the first mandrel bar pattern 380a does not overlap the first edge 311a. In other words, the first mandrel bar pattern 380a shrinks from the edges of the first layout block 320a, thereby avoiding space violations between line patterns in an IC pattern layout.

In some embodiments, a first end 380b1 of the second mandrel bar pattern 380b aligns with a side edge 322be of the extended device patterns 322b, which is the pattern (including the extended device patterns 322a, 322b, 322c, and the extended dummy patterns 360) closest to the seventh edge 317a, outside the second layout block 340a, and connected to the second edge 312a. In some embodiments, a second end 380b2 of the second mandrel bar pattern 380b connects to the extended dummy patterns 360, such as aligned with the third edge 313a. Moreover, in some embodiments, the first end 380b1 is separated from the second layout block 340a, so that the second mandrel bar pattern 380b does not overlap the seventh edge 317a. In other words, the second mandrel bar pattern 380b shrinks from the edges of the first layout block 320a and the second layout block 340a, thereby avoiding space violations between line patterns in an IC pattern layout.

In some embodiments, a first end 380c1 of the third mandrel bar pattern 380c aligns with a side edge 342ae of the extended device patterns 342a, which is the pattern (including the extended device patterns 342a and the extended dummy patterns 360) closest to the fifth edge 315a. In some embodiments, a second end 380c2 of the third mandrel bar pattern 380c aligns with a side edge 360e of the extended dummy patterns 360, which is the pattern (including the extended device patterns 322a. 322b. 322c and the extended dummy patterns 360) closest to the seventh edge 317a, so that the third mandrel bar pattern 380c does not overlap the fifth edge 315a and the seventh edge 317a, thereby avoiding space violations between line patterns in an IC pattern layout.

In other words, the first mandrel bar pattern 380a, the second mandrel bar pattern 380b, and the third mandrel bar pattern 380c will shrink from the first edge 311a and the third edge 313a of the first layout block 320a, and from the fifth edge 315a and the seventh edge 317a of the second layout block 340a to ensure enough space is kept between the patterns. For example, the second mandrel bar pattern 380b is spaced apart from the second layout block 340a in some embodiments. If the extended dummy pattern 360 that overlaps the first edge 311a, the third edge 313a, the fifth edge 315a, or the seventh edge 317a, the mandrel bar pattern (e.g. the first mandrel bar pattern 380a, the second mandrel bar pattern 380b, or the third mandrel bar pattern 380c) will connect to the extended dummy pattern 36) instead of having a space between the mandrel bar pattern and the extended dummy pattern 360.

Although not intended to be limiting, the present disclosure provides many benefits to the manufacturing of an IC. For example, the present disclosure includes a method of avoiding space violations between line patterns in an IC pattern layout. In some embodiments, the device patterns are positioned inside the layout blocks, and dummy patterns having different line width than the device patterns are inserted outside the layout blocks. The IC pattern layout further includes mandrel bar patterns connecting the device patterns and the dummy patterns, where the mandrel bar patterns are disposed lengthwise in a direction perpendicular with the lengthwise direction of the device pattern. In some embodiments, the mandrel bar patterns are aligned with side edges of the extended device patterns or the extended dummy patterns instead of aligned with side edges of the layout block to ensure enough space is between the patterns.

A method for forming a pattern layout is provided in some embodiments of the present disclosure. The method includes receiving an integrated circuit (IC) design layout including a layout block having a first edge, a second edge, a third edge, and a fourth edge sequentially connected to each other, wherein the first edge and the third edge extend in a first direction, and the second edge and the fourth edge extends in a second direction perpendicular to the first direction, wherein first line patterns are disposed inside the layout block along the first direction. The method includes forming a second line pattern disposed outside the layout block parallel to the first line patterns. The method includes forming a mandrel bar pattern oriented along the second direction and overlapping the first line patterns and the second line pattern, wherein the mandrel bar pattern is between the first edge and the third edge, and a first end of the mandrel bar pattern is separated from the first edge and overlaps a first side edge of one of the first line patterns or the second line pattern closest to the first edge. The method includes outputting a pattern layout for mask fabricating, wherein the pattern layout includes the layout block, the first line patterns, second line pattern, and the mandrel bar pattern.

A method for forming a mask is provided in some embodiments of the present disclosure. The method includes receiving an integrated circuit (IC) design layout having a first layout block having a first edge extending in a first direction and a second edge extending in a second direction perpendicular to the first direction, the first layout block including first line patterns extended in the first direction. The method includes adding second line patterns extended in the first direction adjacent to the first layout block. The method includes adding a first mandrel bar pattern extended in the second direction and contacting the first line patterns and the second line patterns, wherein a first end of the first mandrel bar pattern is or aligns with a first side edge of one of the first line patterns or one of the second line patterns adjacent to the first edge, or between the first side edge and the first edge. The method includes outputting a pattern layout in a computer-readable format, wherein the pattern layout includes the layout block, the first and second line patterns, and the first mandrel bar pattern. The method includes fabricating a mask using the pattern layout.

A method of forming a semiconductor structure is provided in some embodiments of the present disclosure. The method includes providing a semiconductor substrate. The method includes forming a mandrel structure over the semiconductor substrate using a first mask, wherein the first mask includes first line patterns in a first layout block and extending along a first direction. The first mask further includes second line patterns outside the first layout block, connecting to the first layout block, and extending along the first direction. The first mask further includes a first mandrel bar disposed between the first line patterns and the second line patterns and extending along a second direction perpendicular to the first direction, wherein a first end of the first mandrel bar is aligned with one of the first line patterns or one of the second line patterns. The method includes performing a cutting process to the mandrel structure to form a fin structure. The method includes forming gates over the fin structure along the second direction.

Although embodiments of the present disclosure and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope of such processes, machines, manufacture, and compositions of matter, means, methods, or steps. In addition, each claim constitutes a separate embodiment, and the combination of various claims and embodiments are within the scope of the disclosure.

What is claimed is:

1. A method for forming a pattern layout, comprising:
receiving an integrated circuit (IC) design layout including a layout block having a first edge, a second edge, a third edge, and a fourth edge sequentially connected to each other, wherein the first edge and the third edge extend in a first direction, and the second edge and the fourth edge extends in a second direction perpendicular to the first direction, wherein first line patterns are disposed inside the layout block along the first direction;
forming second line patterns outside the layout block and parallel to the first line patterns;
forming a mandrel bar pattern oriented along the second direction, wherein the first line patterns and the second line patterns have end edges overlapping an interior region of the mandrel bar pattern, the mandrel bar pattern comprises a first portion and a second portion, the first portion is between the first edge and the third edge and in the layout block, the second portion is outside the layout block, wherein the first portion and the second portion are disposed on different sides of the first edge, and a first end of the mandrel bar pattern is separated from the first edge and is coincident with a first side edge of one of the first line patterns or the second line patterns closest to the first edge; and
outputting the pattern layout for mask fabricating, wherein the pattern layout includes the layout block, the first line patterns, second line patterns, and the mandrel bar pattern.

2. The method as claimed in claim 1, further comprising forming a third line pattern overlapping the third edge of the layout block, wherein a second end of the mandrel bar pattern opposite to the first end connects to the third line pattern.

3. The method as claimed in claim 1, wherein one of the second line patterns is separated from and adjacent to the third edge, and a second end of the mandrel bar pattern opposite to the first end is separated from the third edge and the one of the second line patterns.

4. The method as claimed in claim 3, wherein the second end comprises a second end edge coincident and aligned with a second side edge of one of the first line patterns or the second line patterns closest to the third edge.

5. The method as claimed in claim 1, wherein the length the mandrel bar pattern is less than the length of the second edge.

6. The method as claimed in claim 1, wherein a distance between the mandrel bar pattern and one of the second line patterns that is spaced apart from the layout block is greater than a distance between the first edge and the one of the second line patterns that is spaced apart from the layout block.

7. The method as claimed in claim 1, wherein each of the first line patterns comprises a first end, each of the second line patterns comprises a second end, the first end has a first end edge extending in the second direction, and the second end has a second end edge extending in the second direction;
wherein the first end edge, the second end edge, and the first edge are edge-aligned with each other.

8. A method for forming a mask, comprising:
receiving an integrated circuit (IC) design layout comprising a first layout block having a first edge extending in a first direction and a second edge extending in a second direction perpendicular to the first direction, the first layout block including first line patterns extended in the first direction;
adding second line patterns extended in the first direction adjacent to the first layout block, wherein an end of at least one of the first line patterns and an end of at least one of the second line patterns have partially coincident edges;
adding a first mandrel bar pattern extended in the second direction and contacting the first line patterns and the second line patterns, wherein a first end of the first mandrel bar pattern has a first end edge, and the first end edge is edge-aligned aligns with a first side edge of one of the first line patterns or one of the second line patterns adjacent to the first edge, or between the first side edge and the first edge;
outputting a pattern layout in a computer-readable format, wherein the pattern layout includes the layout block, the first and second line patterns, and the first mandrel bar pattern; and
fabricating a mask using the pattern layout.

9. The method as claimed in claim 8, wherein the IC design layout further comprises a second layout block arranged with the first layout block in the second direction, and the method further comprises:
adding third line patterns in the second layout block;
adding fourth line patterns outside and surrounding the second layout block, wherein the third line patterns and the fourth line patterns extend in the first direction; and
adding a second mandrel bar pattern overlapping the third line patterns and the fourth line patterns.

10. The method as claimed in claim 9, wherein the first mandrel bar pattern and the second mandrel bar pattern are arranged in the second direction, and a distance between the first mandrel bar pattern and the second mandrel bar pattern is greater than a distance between the first layout block and the second layout block.

11. The method as claimed in claim 9, wherein a second end of the first mandrel bar pattern opposite to the first end overlaps another one of the second line patterns overlapping a third edge of the first layout block.

12. The method as claimed in claim 11, wherein a third end of the second mandrel bar pattern is aligned with a second side edge of one of the third line patterns, and a fourth end of the second mandrel bar pattern opposite to the third end is aligned with a third side edge of another one of the third line patterns or the fourth line patterns.

13. The method as claimed in claim 8, wherein the first line patterns partially connect to the second line patterns below an area covered by the first mandrel bar pattern.

14. A method of forming a mask, comprising:
receiving an integrated circuit (IC) design layout comprising a first layout block;
adding first line patterns in the first layout block and extending along a first direction;
adding second line patterns outside the first layout block, connecting to the first layout block, and extending along the first direction;
adding a first mandrel bar between the first line patterns and the second line patterns and extending along a second direction perpendicular to the first direction, wherein a first end of the first mandrel bar and one of the first line patterns or one of the second line patterns have coincident edges, the first mandrel bar comprises an interior region overlapping the first line patterns and the second line patterns, wherein an area of the first mandrel bar overlapping the first line patterns and the second line patterns is greater than zero;

outputting a pattern layout in a computer-readable format, wherein the pattern layout includes the layout block, the first and second line patterns, and the first mandrel bar pattern; and fabricating a mask using the pattern layout.

15. The method as claimed in claim 14, further comprising:

adding a second mandrel bar disposed between the first line patterns and the second line patterns, wherein the first layout block comprises a first edge, a second edge, a third edge, and a fourth edge arranged sequentially, the first edge and the third edge extend in the first direction, and the second edge and the fourth edge extend in the second direction, wherein the first mandrel bar overlaps the fourth edge, and the second mandrel bar overlaps the second edge.

16. The method as claimed in claim 15, wherein the first mandrel bar and the second mandrel bar are different in length.

17. The method as claimed in claim 15, wherein the integrated circuit design layout further comprises a second layout block, and the method further comprises:

adding third line patterns in the second layout block and extending along the first direction;

adding fourth line patterns outside the second layout block and connecting to the second layout block; and adding a third mandrel bar between the third line patterns and the fourth line patterns, wherein the first mandrel bar and the third mandrel bar are different in length.

18. The method as claimed in claim 17, wherein the first layout block and the second layout block are arranged in the first direction, and the second mandrel bar is spaced apart from the second layout block.

19. The method as claimed in claim 17, wherein the second layout block comprises a fifth edge, a sixth edge, a seventh edge, and an eighth edge arranged sequentially, the fifth edge and the seventh edge extend in the first direction, and the sixth edge and the eighth edge extend in the second direction, wherein the second edge aligns with the eighth edge, and one of the first line patterns connects to one of the third line patterns.

20. The method as claimed in claim 14, wherein the first line patterns connect to the second line patterns on an edge of the first layout block.

* * * * *